US010018833B2

United States Patent
Murayama et al.

(10) Patent No.: US 10,018,833 B2
(45) Date of Patent: Jul. 10, 2018

(54) MEMS DEVICE AND ELECTRONIC DEVICE HAVING PROJECTOR FUNCTION

(71) Applicant: Funai Electric Co., Ltd., Daito-shi, Osaka (JP)

(72) Inventors: Manabu Murayama, Daito (JP); Kouichi Kugo, Daito (JP); Naoki Inoue, Daito (JP); Hitoshi Fujii, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 72 days.

(21) Appl. No.: 14/372,367

(22) PCT Filed: Jan. 8, 2013

(86) PCT No.: PCT/JP2013/050133
§ 371 (c)(1),
(2) Date: Jul. 15, 2014

(87) PCT Pub. No.: WO2013/114917
PCT Pub. Date: Aug. 8, 2013

(65) Prior Publication Data
US 2014/0355089 A1    Dec. 4, 2014

(30) Foreign Application Priority Data

Feb. 3, 2012 (JP) ................... 2012-021861

(51) Int. Cl.
*G02B 26/10* (2006.01)
*G02B 26/08* (2006.01)
(Continued)

(52) U.S. Cl.
CPC .......... *G02B 26/101* (2013.01); *B81B 3/0062* (2013.01); *G02B 26/0833* (2013.01);
(Continued)

(58) Field of Classification Search
CPC ........................... B81B 3/0083; B81B 3/0086
(Continued)

(56) References Cited

U.S. PATENT DOCUMENTS 7,221,493 B2* 5/2007 Fujii ........................ B41J 2/471
216/24
7,327,508 B2* 2/2008 Song .................. G02B 26/0808
349/201
(Continued)

FOREIGN PATENT DOCUMENTS

| CN | 1820407 A | 8/2006 |
| JP | 2007-310196 A | 11/2007 |

(Continued)

OTHER PUBLICATIONS

International Search Report dated Apr. 16, 2013 including English translation (seven (7) pages).
(Continued)

*Primary Examiner* — Brandi Thomas
*Assistant Examiner* — Travis Fissel
(74) *Attorney, Agent, or Firm* — Crowell & Moring LLP

(57) ABSTRACT

In a MEMS device (1), a first drive portion (40) is divided into a first drive section (41) and a second drive section (42). A second drive portion (50) is divided into a third drive section (51) and a fourth drive section (52). The first drive section, the second drive section, the third drive section, and the fourth drive section are controlled for driving independently of each other to incline an optical component (10).

19 Claims, 11 Drawing Sheets

(51) Int. Cl.
  *B81B 3/00* (2006.01)
  *G02B 27/64* (2006.01)
(52) U.S. Cl.
  CPC ..... *G02B 26/0841* (2013.01); *G02B 26/0858* (2013.01); *G02B 26/105* (2013.01); *G02B 27/646* (2013.01); *B81B 2201/042* (2013.01)
(58) Field of Classification Search
  USPC ......... 359/199.1–199.4, 224.2, 200.6–200.8; 347/257–260
  See application file for complete search history.

(56) References Cited

U.S. PATENT DOCUMENTS

| | | | | |
|---|---|---|---|---|
| 7,355,317 | B2* | 4/2008 | Greywall | G02B 26/0833 |
| | | | | 310/309 |
| 7,436,567 | B2* | 10/2008 | Ueyama | G02B 26/105 |
| | | | | 359/224.1 |
| 7,518,287 | B2* | 4/2009 | Hirasawa | G02B 27/646 |
| | | | | 310/323.02 |
| 7,619,798 | B2* | 11/2009 | Matsuda | G02B 26/105 |
| | | | | 359/199.4 |
| 8,098,415 | B2 | 1/2012 | Kanno et al. | |
| 8,235,534 | B2 | 8/2012 | Nakayama et al. | |
| 8,917,434 | B2 | 12/2014 | Kotera et al. | |
| 2004/0008400 | A1* | 1/2004 | Hill | G02B 26/0841 |
| | | | | 359/290 |
| 2006/0208607 | A1* | 9/2006 | Yoon | G02B 26/0841 |
| | | | | 310/309 |
| 2006/0220492 | A1 | 10/2006 | Greywall | |
| 2006/0268388 | A1* | 11/2006 | Miles | G02B 26/0841 |
| | | | | 359/291 |
| 2007/0024715 | A1 | 2/2007 | Hirasawa et al. | |
| 2007/0146858 | A1 | 6/2007 | Matsuda | |
| 2007/0158552 | A1* | 7/2007 | Kim | G02B 26/0841 |
| | | | | 250/306 |
| 2009/0261688 | A1* | 10/2009 | Xie | B81B 3/0035 |
| | | | | 310/307 |
| 2010/0142023 | A1* | 6/2010 | Kanno | G02B 26/0841 |
| | | | | 359/224.1 |
| 2010/0296145 | A1* | 11/2010 | Takeda | B81B 3/0059 |
| | | | | 359/223.1 |
| 2011/0032590 | A1 | 2/2011 | Terada et al. | |
| 2011/0081770 | A1* | 4/2011 | Tombler, Jr. | B82Y 10/00 |
| | | | | 438/466 |
| 2011/0141441 | A1* | 6/2011 | Konno | G02B 26/0841 |
| | | | | 353/69 |
| 2012/0026567 | A1 | 2/2012 | Murayama et al. | |

FOREIGN PATENT DOCUMENTS

| | | |
|---|---|---|
| JP | 2008-145839 A | 6/2008 |
| JP | 2009-229517 A | 10/2009 |
| JP | 2010-26069 A | 2/2010 |
| JP | 2010-148265 A | 7/2010 |
| WO | WO 2005/122380 A1 | 12/2005 |
| WO | WO 2009/142015 A1 | 11/2009 |
| WO | WO 2011/081045 A2 | 7/2011 |

OTHER PUBLICATIONS

Japanese-language Written Opinion (PCT/ISA/237) dated Apr. 16, 2013 (six (6) pages).

* cited by examiner

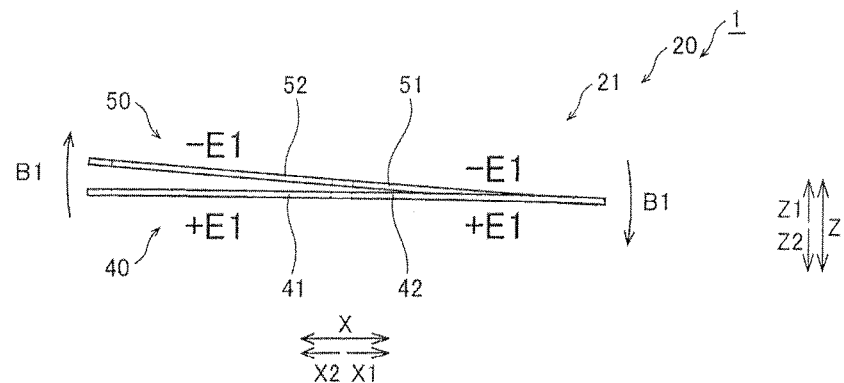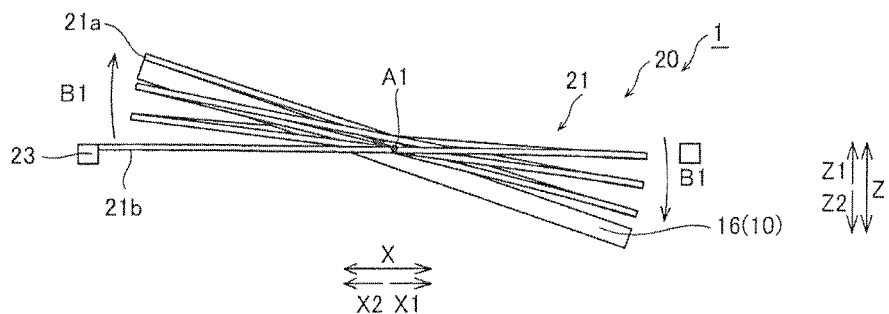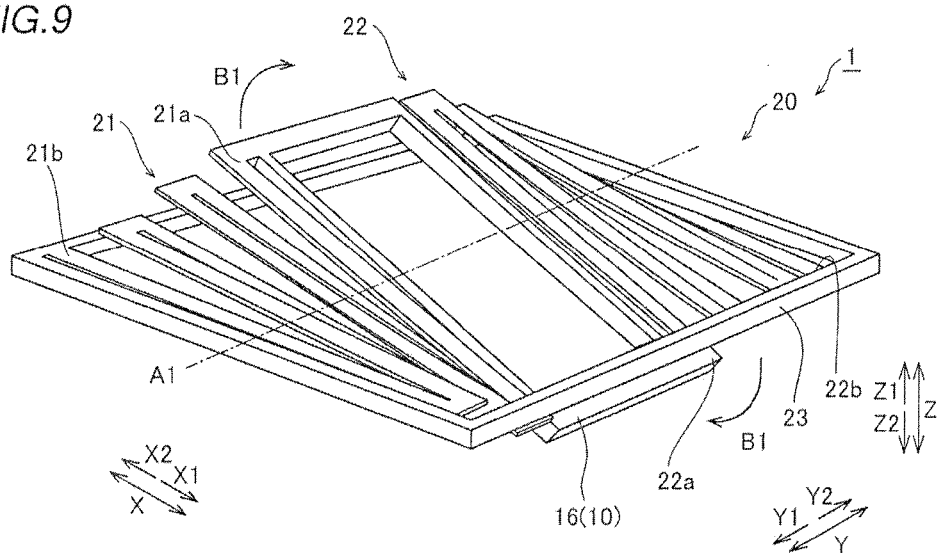

MEMS DEVICE AND ELECTRONIC DEVICE HAVING PROJECTOR FUNCTION

TECHNICAL FIELD

The present invention relates to a MEMS device and an electronic device having a projector function, and more particularly, it relates to a MEMS device including a drive portion configured to incline an optical component and an electronic device having a projector function, including a laser scanning portion with the MEMS device.

BACKGROUND ART

In general, a MEMS (Micro Electro Mechanical Systems) device including a drive portion configured to incline an optical component is known, as disclosed in Japanese Patent Laying-Open No. 2010-148265, for example.

In Japanese Patent Laying-Open No. 2010-148265, there is disclosed an optical reflective device (MEMS device) including a mirror portion, a pair of meandering oscillators provided to hold the mirror portion, first ends of which are connected to the mirror portion, and a frame-shaped support connected with second ends of the meandering oscillators. These meandering oscillators include a plurality of drive elements each deformed in a prescribed shape by prescribed drive control. The plurality of drive elements are divided into a first system in which drive control is performed collectively and a second system in which drive control different from that of the first system is performed collectively. In drive element groups of the first system and the second system of the meandering oscillators according to Japanese Patent Laying-Open No. 2010-148265, drive control is performed such that the driving states are opposite to each other. The deformation of the drive elements of the systems is accumulated in the meandering oscillators, whereby the mirror portion is resonantly oscillated about a prescribed rotation axis line.

PRIOR ART

Patent Document

Patent Document 1: Japanese Patent Laying-Open No. 2010-148265

SUMMARY OF THE INVENTION

Problem to be Solved by the Invention

In the optical reflective device according to Japanese Patent Laying-Open No. 2010-148265, however, drive control is performed collectively in each of the first system and the second system, and hence drive control cannot be performed between the drive elements in the first system, and drive control different from each other cannot be performed between the drive elements in the second system. In other words, only displacement along one determined direction can be accumulated in the meandering oscillators, and hence there is such a problem that the mirror portion can be inclined only about a uniaxial rotation axis line generated by the displacement of a vibration plate in one direction.

The present invention has been proposed in order to solve the aforementioned problem, and an object of the present invention is to provide a MEMS device capable of inclining an optical component about a plurality of rotation axis lines.

Means for Solving the Problem

A MEMS device according to a first aspect of the present invention includes an optical component and a drive portion including a drive unit having a first drive portion and a second drive portion extending in a first direction, arranged along a second direction substantially orthogonal to the first direction and a first connecting portion connecting the first drive portion to the second drive portion, configured to incline the optical component, while the first drive portion is divided into a first drive section on a first side in the first direction and a second drive section on a second side in the first direction, the second drive portion is divided into a third drive section on the second side in the first direction connected to the second drive section through the first connecting portion and a fourth drive section on the first side in the first direction, the first drive section, the second drive section, the third drive section, and the fourth drive section are configured to be controlled for driving independently of each other, and the first drive section, the second drive section, the third drive section, and the fourth drive section are controlled for driving independently of each other to incline the optical component.

In the MEMS device according to the first aspect of the present invention, as hereinabove described, the first drive portion is divided into the first drive section on the first side in the first direction and the second drive section on the second side in the first direction, the second drive portion is divided into the third drive section on the second side in the first direction and the fourth drive section on the first side in the first direction, and the first drive section, the second drive section, the third drive section, and the fourth drive section are controlled for driving independently of each other to incline the optical component, whereby the different driving states of the first drive section, the second drive section, the third drive section, and the fourth drive section controllable for driving differently can be combined, and hence the driving state of the first drive portion and the driving state of the second drive portion can be differentiated. Thus, the optical component can be inclined not only about a uniaxial rotation axis line but also about rotation axis lines other than that, unlike the case where the driving state of the first drive portion and the driving state of the second drive portion are the same. Consequently, the optical component can be inclined about a plurality of rotation axis lines.

In the aforementioned MEMS device according to according to the first aspect, the first drive section, the second drive section, the third drive section, and the fourth drive section are preferably controlled for driving independently of each other to incline the optical component in a biaxial direction about a first rotation axis line and a second rotation axis line extending in the first direction and the second direction substantially orthogonal to each other in the same plane, respectively. According to this structure, drive control for inclination about the first rotation axis line and drive control for inclination about the second rotation axis line can be independent of each other, and the optical component can be easily inclined in the biaxial direction by combining the inclination about the first rotation axis line and the inclination about the second rotation axis line.

In this case, the first drive section and the second drive section are preferably controlled for driving substantially in the same manner and the third drive section and the fourth drive section are preferably controlled for driving substantially in the same manner to incline the optical component about the first rotation axis line. According to this structure, systems of drive control are consolidated into two, so that the optical component can be inclined about the first rotation axis line by simple drive control, as compared with the case where drive control of driving the first drive section, the second drive section, the third drive section, and the fourth drive section completely independently of each other is performed.

In the aforementioned structure in which the optical component is inclined in the biaxial direction, the first drive section and the third drive section are preferably controlled for driving substantially in the same manner and the second drive section and the fourth drive section are preferably controlled for driving substantially in the same manner to incline the optical component about the second rotation axis line. According to this structure, systems of drive control are consolidated into two, so that the optical component can be inclined about the second rotation axis line by simple drive control, as compared with the case where drive control of driving the first drive section, the second drive section, the third drive section, and the fourth drive section completely independently of each other is performed.

In the aforementioned structure in which the optical component is inclined in the biaxial direction, the first drive section and the second drive section are preferably controlled for driving substantially in the same manner and the third drive section and the fourth drive section are preferably controlled for driving substantially in the same manner to incline the optical component about the first rotation axis line, the first drive section and the third drive section are preferably controlled for driving substantially in the same manner and the second drive section and the fourth drive section are preferably controlled for driving substantially in the same manner to incline the optical component about the second rotation axis line, and in the first drive section, the second drive section, the third drive section, and the fourth drive section, drive control about the first rotation axis line and drive control about the second rotation axis line are preferably combined to incline the optical component in the biaxial direction about the first rotation axis line and the second rotation axis line. According to this structure, the optical component can be inclined in the biaxial direction about the first rotation axis line and the second rotation axis line.

In the aforementioned MEMS device according to the first aspect, the first drive portion is preferably divided into the first drive section and the second drive section in the vicinity of a central portion of the first drive portion in the first direction, and the second drive portion is preferably divided into the third drive section and the fourth drive section in the vicinity of a central portion of the second drive portion in the first direction. According to this structure, the driving states of the first drive portion and the second drive portion can be differentiated in the vicinity of the central portions of the first drive portion and the second drive portion, and hence the first drive portion and the second drive portion can be more stably driven, as compared with the case where the first drive portion and the second drive portion are divided at positions distanced from the central portions. Thus, the inclination of the optical component can be reliably controlled.

In this case, the first drive section and the second drive section of the first drive portion are preferably formed to have substantially the same length in the first direction, and the third drive section and the fourth drive section of the second drive portion are preferably formed to have substantially the same length in the first direction. According to this structure, the drive characteristics of the first drive section and the drive characteristics of the second drive section can be rendered substantially the same, and the drive characteristics of the third drive section and the drive characteristics of the fourth drive section can be rendered substantially the same, and hence the first drive portion and the second drive portion can be more stably driven. Thus, the inclination of the optical component can be more reliably controlled.

In the aforementioned MEMS device according to the first aspect, the first drive section and the second drive section of the first drive portion are preferably formed in a state where the first drive section and the second drive section are separated from each other by a first distance in the first direction, the third drive section and the fourth drive section of the second drive portion are preferably formed in a state where the third drive section and the fourth drive section are separated from each other by a second distance in the first direction, and the first distance and the second distance are preferably smaller than the width of the first drive portion in the second direction and the width of the second drive portion in the second direction, respectively. According to this structure, a region for forming the first drive section and the second drive section can be sufficiently ensured in the first drive portion, and a region for forming the third drive section and the fourth drive section can be sufficiently ensured in the second drive portion. Thus, the first drive section, the second drive section, the third drive section, and the fourth drive section can be formed to such an extent to sufficiently ensure the inclination of the optical component.

In the aforementioned MEMS device according to the first aspect, a pair of drive portions are preferably provided to hold the optical component therebetween, and the pair of drive portions are preferably formed to be substantially point-symmetric to each other, using a substantially central portion of the optical component as a symmetry center. According to this structure, the optical component can be greatly inclined by combining the driving states of the pair of drive portions. Furthermore, the pair of drive portions are formed to be substantially point-symmetric to each other, using the substantially central portion of the optical component as the symmetry center, whereby the drive characteristics of the pair of drive portions can be rendered substantially the same, and hence the inclination of the optical component can be easily controlled, as compared with the case where the pair of drive portions are not symmetric to each other.

In this case, the pair of drive portions substantially point-symmetric to each other are preferably controlled for driving in a different manner. According to this structure, the optical component can be easily inclined about the plurality of rotation axis lines by combining the different driving states of the pair of drive portions that are substantially point-symmetric to each other.

In the aforementioned MEMS device according to the first aspect, a plurality of drive units are preferably arranged along the second direction, and the drive portion preferably further includes a second connecting portion connecting the first drive section of the drive unit to the fourth drive section of the drive unit that is adjacent and is preferably formed to meander by connection of the plurality of drive units. According to this structure, the optical component can be more greatly inclined by connecting the plurality of drive units to each other to combine the driving states of the plurality of drive units. Furthermore, the drive portion is formed to meander, whereby the entire length of the drive portion can be sufficiently ensured while an excessive increase in the length of the drive portion in only one of the first direction and the second direction is suppressed.

In the aforementioned MEMS device according to the first aspect, the first drive section, the second drive section, the third drive section, and the fourth drive section are preferably configured to be driven by deformation of a piezoelectric body resulting from voltage application to the piezoelectric body and preferably have a first drive electrode, a second drive electrode, a third drive electrode, and a fourth drive electrode, respectively, and the first drive section, the second drive section, the third drive section, and the fourth drive section are preferably controlled for driving independently of each other by application of voltages different from each other to the first drive electrode, the second drive electrode, the third drive electrode, and the fourth drive electrode. According to this structure, the voltages different from each other are applied to the first drive electrode, the second drive electrode, the third drive electrode, and the fourth drive electrode, whereby the first drive section, the second drive section, the third drive section, and the fourth drive section can be easily controlled for driving independently of each other.

In this case, the MEMS device preferably further includes a movable portion where the optical component is arranged, connected to a first end of the drive portion and a fixing portion fixing a second end of the drive portion, the drive portion preferably further includes a detection electrode capable of detecting the driving of the drive portion based on deformation of the piezoelectric body, and the detection electrode is preferably provided in the drive unit located at the second end of the drive portion fixed to the fixing portion. According to this structure, the driving of the drive portion can be more reliably controlled on the basis of a detection result of the detection electrode. Furthermore, the detection electrode is provided in the drive unit located at the second end of the drive portion fixed to the fixing portion, whereby the detection electrode can be provided in the vicinity of the fixing frame, and hence wiring can be easily extended from the fixing frame to the detection electrode.

The aforementioned MEMS device according to the first aspect preferably further includes a movable portion where the optical component is arranged, connected to a first end of the drive portion, a fixing portion fixing a second end of the drive portion, and a spacer configured to provide the optical component in a stacked arrangement in the movable portion in a state where the optical component and the drive portion are separated from each other in a third direction substantially orthogonal to the first direction and the second direction. According to this structure, the optical component, the movable portion, and the drive portion can be provided in the stacked arrangement in the third direction, and hence an increase in the size of the MEMS device in the first direction and the second direction can be suppressed as compared with the case where the optical component, the movable portion, and the drive portion are arranged in the same plane extending in the first direction and the second direction. Furthermore, the optical component and the drive portion can be separated from each other, and hence a deviation of the inclination of the optical component from an intended inclination resulting from contact of the optical component with the drive portion can be suppressed.

In the aforementioned MEMS device according to the first aspect, the optical component is preferably configured to be resonantly driven, and the drive portion is preferably configured to perform non-resonant drive. According to this structure, the optical component is resonantly driven, whereby the optical component can scan a larger range. Furthermore, the drive portion is configured to perform non-resonant drive, whereby difficulty in drive control of the drive portion can be suppressed, as compared with the case where the drive portion performs resonant drive, and the inclined state of the optical component can be easily maintained.

An electronic device having a projector function according to a second aspect of the present invention includes a laser beam generation portion emitting a laser beam, a control portion analyzing an input picture and recognizing pixel information, and a laser scanning portion including a MEMS device scanning the laser beam, while the MEMS device includes an optical component capable of scanning the laser beam and a drive portion including a drive unit having a first drive portion and a second drive portion extending in a first direction, arranged along a second direction substantially orthogonal to the first direction and a first connecting portion connecting the first drive portion to the second drive portion, configured to incline the optical component, the first drive portion is divided into a first drive section on a first side in the first direction and a second drive section on a second side in the first direction, the second drive portion is divided into a third drive section on the second side in the first direction connected to the second drive section through the first connecting portion and a fourth drive section on the first side in the first direction, the first drive section, the second drive section, the third drive section, and the fourth drive section are configured to be controlled for driving independently of each other, and the first drive section, the second drive section, the third drive section, and the fourth drive section are controlled for driving independently of each other to incline the optical component.

In the electronic device having a projector function according to the second aspect of the present invention, as hereinabove described, the first drive portion is divided into the first drive section on the first side in the first direction and the second drive section on the second side in the first direction, the second drive portion is divided into the third drive section on the second side in the first direction and the fourth drive section on the first side in the first direction, and the first drive section, the second drive section, the third drive section, and the fourth drive section are controlled for driving independently of each other to incline the optical component, whereby the different driving states of the first drive section, the second drive section, the third drive section, and the fourth drive section controllable for driving differently can be combined, and hence the driving state of the first drive portion and the driving state of the second drive portion can be differentiated. Thus, the optical component can be inclined not only about a uniaxial rotation axis line but also about rotation axis lines other than that, unlike the case where the driving state of the first drive portion and the driving state of the second drive portion are the same. Consequently, the optical component can be inclined about a plurality of rotation axis lines. Therefore, the optical component inclinable about the plurality of rotation axis lines can scan the laser beam, and hence the scanning position of the laser beam can be adjusted precisely in the electronic device having a projector function.

The aforementioned electronic device having a projector function according to the second aspect preferably further includes a vibration detecting portion capable of detecting vibration of the electronic device, and the control portion is preferably configured to correct a shake by performing control of inclining the optical component of the MEMS device on the basis of the vibration of the electronic device resulting from the shake detected by the vibration detecting portion. According to this structure, the shake can be reliably corrected in the portable electronic device having a projector function.

In the aforementioned electronic device having a projector function according to the second aspect, the first drive section, the second drive section, the third drive section, and the fourth drive section are preferably controlled for driving independently of each other to incline the optical component in a biaxial direction about a first rotation axis line and a second rotation axis line extending in the first direction and the second direction substantially orthogonal to each other in the same plane, respectively. According to this structure, drive control for inclination about the first rotation axis line and drive control for inclination about the second rotation axis line can be independent of each other, and the optical component can be easily inclined in the biaxial direction by combining the inclination about the first rotation axis line and the inclination about the second rotation axis line.

In the aforementioned electronic device having a projector function according to the second aspect, the first drive section and the second drive section are preferably controlled for driving substantially in the same manner and the third drive section and the fourth drive section are preferably controlled for driving substantially in the same manner to incline the optical component about the first rotation axis line. According to this structure, systems of drive control are consolidated into two, so that the optical component can be inclined about the first rotation axis line by simple drive control, as compared with the case where drive control of driving the first drive section, the second drive section, the third drive section, and the fourth drive section completely independently of each other is performed.

In the aforementioned electronic device having a projector function according to the second aspect, the first drive section and the third drive section are preferably controlled for driving substantially in the same manner and the second drive section and the fourth drive section are preferably controlled for driving substantially in the same manner to incline the optical component about the second rotation axis line. According to this structure, systems of drive control are consolidated into two, so that the optical component can be inclined about the second rotation axis line by simple drive control, as compared with the case where drive control of driving the first drive section, the second drive section, the third drive section, and the fourth drive section completely independently of each other is performed.

Effect of the Invention

According to the present invention, as hereinabove described, the optical component can be inclined about the plurality of rotation axis lines.

BRIEF DESCRIPTION OF THE DRAWINGS

FIG. 7 A side elevational view showing drive control of a drive unit in the inclination about the rotation axis line A1 of the light scanning portion according to the first embodiment of the present invention.

FIG. 8 A side elevational view showing the driving of a drive portion in the inclination about the rotation axis line A1 of the light scanning portion according to the first embodiment of the present invention.

FIG. 9 A perspective view showing the laser scanning portion in the inclination about the rotation axis line A1 of the light scanning portion according to the first embodiment of the present invention.

MODES FOR CARRYING OUT THE INVENTION

First Embodiment

The structure of a portable electronic device 100 according to a first embodiment of the present invention is now described with reference to FIGS. 1 to 5. The portable electronic device 100 is an example of the "electronic device having a projector function" in the present invention.

Figure 1:
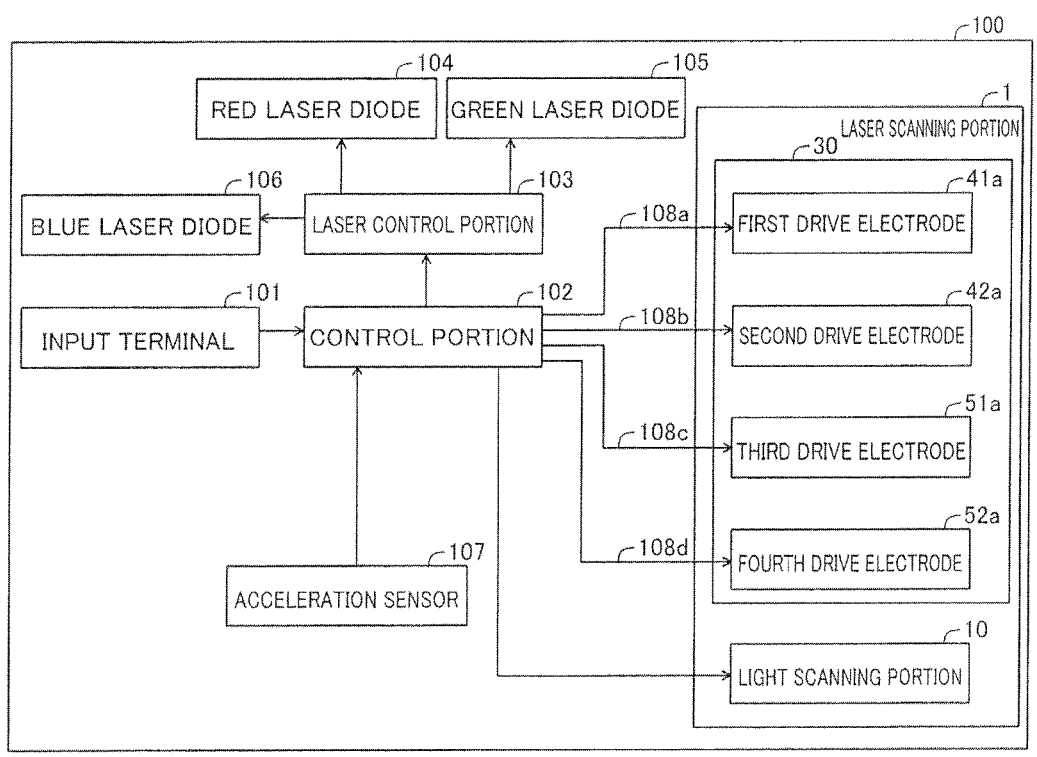
FIG. 1 A block diagram showing the structure of a portable electronic device according to a first embodiment of the present invention.

The portable electronic device 100 according to the first embodiment of the present invention includes an input terminal 101 into which a video signal is externally input, a control portion 102 analyzing the video signal input through the input terminal 101 and recognizing pixel information, a laser control portion 103 configured to output the pixel information as a picture, a red laser diode 104, a green laser diode 105, a blue laser diode 106, and a laser scanning portion 1, as shown in FIG. 1. In other words, the portable electronic device 100 has a projector function with which input video information can be output as a picture. The red laser diode 104, the green laser diode 105, and the blue laser diode 106 are examples of the "laser beam generation portion" in the present invention, and the laser scanning portion 1 is an example of the "MEMS device" in the present invention.

The laser control portion 103 is configured to control emission of the red laser diode 104, the green laser diode 105, and the blue laser diode 106 on the basis of the pixel information recognized by the control portion 102. The red laser diode 104 is configured to be capable of emitting a red laser beam, the green laser diode 105 is configured to be capable of emitting a green laser beam, and the blue laser diode 106 is configured to be capable of emitting a blue laser beam. The laser scanning portion 1 is configured to project a picture on a prescribed projection position by reflecting laser beams from the red laser diode 104, the green laser diode 105, and the blue laser diode 106.

The portable electronic device 100 further includes an acceleration sensor 107. The acceleration sensor 107 has a function of detecting a motion direction of vibration resulting from a shake of the portable electronic device 100. The control portion 102 is configured to adjust the position of the picture projected by the laser scanning portion 1 by inclining a light scanning portion 10 described later of the laser scanning portion 1 in a biaxial direction in a direction opposite to the motion direction of the vibration resulting from the shake detected by the acceleration sensor 107. Consequently, blurring (distortion) of the picture resulting from the shake is suppressed. A tilt movement in the biaxial direction of the light scanning portion 10 in the laser scanning portion 1 is described later. The acceleration sensor 107 is an example of the "vibration detecting portion" in the present invention.

Figure 2:
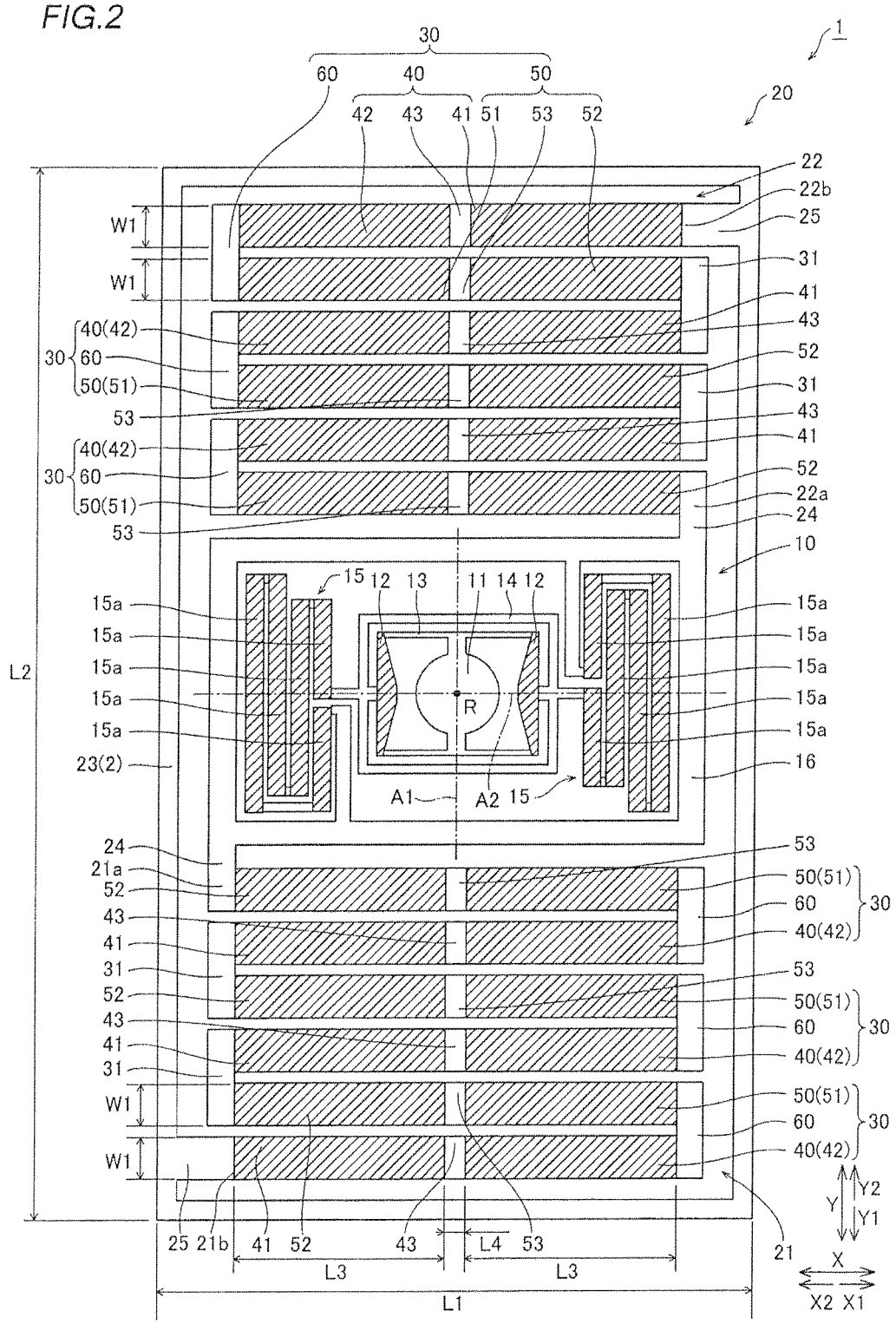
FIG. 2 A plan view showing a laser scanning portion according to the first embodiment of the present invention.

The laser scanning portion 1 is made of a base material 2 having a thickness of at least about 10 μm and not more than about 100 μm and includes the light scanning portion 10 and a shake correcting portion 20 formed to surround the light scanning portion 10, as shown in FIG. 2. The base material 2 is made of any one of Si, SUS, and Ti or a composite material of those. The light scanning portion 10 is an example of the "optical component" in the present invention.

The light scanning portion 10 includes a mirror portion 11, resonant drive portions 12, a connecting portion 13 connecting the mirror portion 11 to the resonant drive portions 12, an inner frame 14 formed in a frame shape to surround the mirror portion 11, the resonant drive portions 12, and the connecting portion 13, and non-resonant drive portions 15. A movable frame 16 is arranged between the light scanning portion 10 and the shake correcting portion 20. The movable frame 16 is an example of the "movable portion" in the present invention.

The mirror portion 11 has a function of reflecting the laser beams from the red laser diode 104, the green laser diode 105, and the blue laser diode 106 (see FIG. 1). A pair of resonant drive portions 12 are formed to hold the mirror portion 11 in the short-side direction (direction X) of the laser scanning portion 1. A pair of non-resonant drive portions 15 are formed to hold the mirror portion 11, the resonant drive portions 12, the connecting portion 13, and the inner frame 14 in the direction X and each have a structure in which five drive sections 15a are connected to each other. The resonant drive portions 12 and the drive sections 15a are configured to be convexly or concavely deformable in a vertical direction (direction Z, see FIG. 3). The direction X is an example of the "first direction" in the present invention.

The resonant drive portions 12 are configured to oscillate the mirror portion 11 about a rotation axis line A1 extending in the longitudinal direction (direction orthogonal to the short-side direction in the same plane, direction Y) of the laser scanning portion 1. The non-resonant drive portions 15 are configured to oscillate the mirror portion 11 about a rotation axis line A2 extending in the short-side direction (direction X) of the laser scanning portion 1. Thus, the light scanning portion 10 is configured to be capable of scanning a laser beam. The resonant drive portions 12 are configured to resonate the mirror portion 11 at a resonant frequency of about 30 kHz to oscillate the same, and the non-resonant drive portions 15 are configured not to resonate the mirror portion 11 at a frequency of about 60 Hz to oscillate the same. The direction Y is an example of the "second direction" in the present invention.

The movable frame 16 is formed in a frame shape to surround the inner frame 14 and the non-resonant drive portions 15. In order to illustrate the structure of the shake correcting portion 20 in detail, the internal structure of the light scanning portion 10 excluding the movable frame 16 is not illustrated in FIGS. 3, 6, 9, 10, and 14 to 16.

Figure 3:
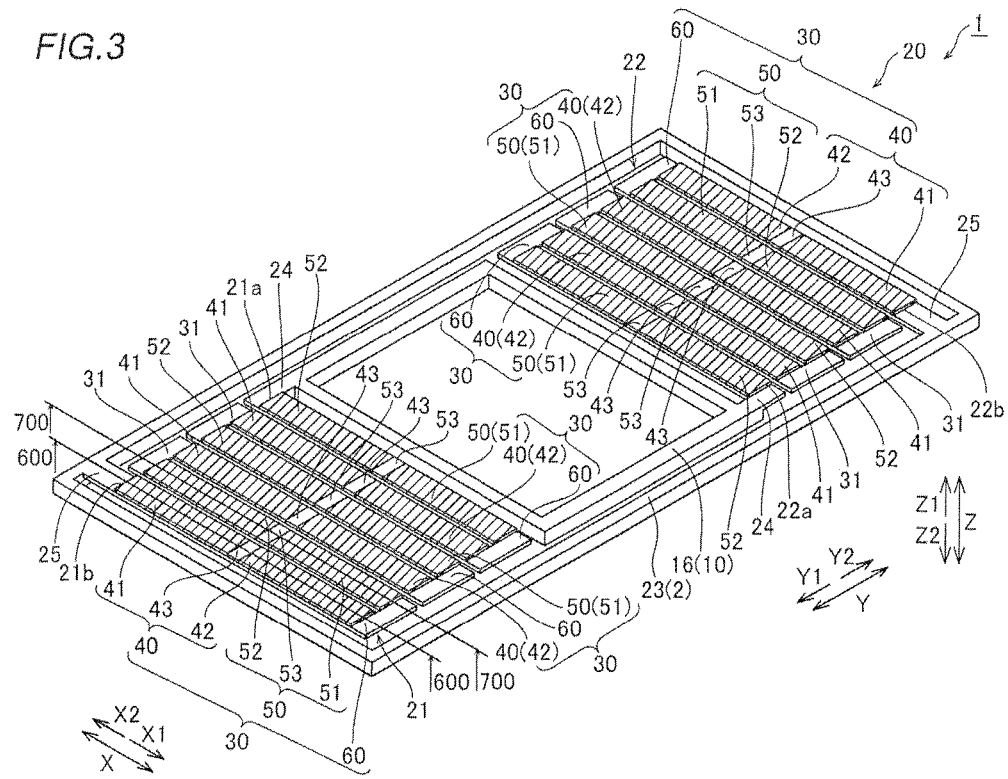
FIG. 3 A perspective view showing the laser scanning portion according to the first embodiment of the present invention.

The shake correcting portion 20 includes a pair of drive portions 21 and 22 holding the light scanning portion 10 in the longitudinal direction (direction Y) of the laser scanning portion 1 and a fixing frame 23 connected to the pair of drive portions 21 and 22, as shown in FIGS. 2 and 3. The drive portions 21 and 22 are configured to be capable of inclining the movable frame 16 (light scanning portion 10) in the biaxial direction about the rotation axis line A1 and the rotation axis line A2 and maintaining the inclined state, as shown in FIG. 2. The fixing frame 23 is formed in a frame shape to surround the light scanning portion 10 and the pair of drive portions 21 and 22 in a plan view, has a length L1 of at least about 3 mm and not more than about 10 mm in the short-side direction (direction X), and has a length L2 of at least about 5 mm and not more than about 20 mm in the longitudinal direction (direction Y). The fixing frame 23 is fixed to an unshown fixing section of the portable electronic device 100 (see FIG. 1). The fixing frame 23 is an example of the "fixing portion" in the present invention.

A first end 21a of the drive portion 21 located on the Y1 side of the light scanning portion 10 is connected to a corner on the X2 side and the Y1 side of the movable frame 16 of the light scanning portion 10 through a connecting portion 24, and a first end 22a of the drive portion 22 located on the Y2 side of the light scanning portion 10 is connected to a corner on the X1 side and the Y2 side of the movable frame 16 of the light scanning portion 10 through a connecting portion 24. Thus, both the first end 21a of the drive portion 21 and the first end 22a of the drive portion 22 are connected to the movable frame 16.

A second end 21b of the drive portion 21 is connected to the vicinity of a corner on the X2 side and the Y1 side of the fixing frame 23 through a connecting portion 25, and a second end 22b of the drive portion 22 is connected to the vicinity of a corner on the X1 side and the Y2 side of the fixing frame 23 through a connecting portion 25. Thus, both the second end 21b of the drive portion 21 and the second end 22b of the drive portion 22 are connected to the fixing frame 23.

As shown in FIG. 2, the drive portion 21 and the drive portion 22 have the same structure and are arranged to be substantially point-symmetric to each other, using the center R of the mirror portion 11 of the light scanning portion 10 as a symmetric point. In other words, the drive portion 22 is arranged to substantially overlap with the drive portion 21 by rotating by 180 degrees about the center R of the mirror portion 11. Therefore, only the drive portion 21 on the Y1 side is hereinafter described in detail. The center R is an example of the "symmetry center" in the present invention.

The drive portion 21 includes three drive units 30 arranged to be substantially parallel to each other along the direction Y and two connecting portions 31. The three drive units 30 each are formed in a U shape. The connecting portions 31 each extend in the direction Y to be formed in a rectangular shape and are configured to connect an end on the Y2 side of a drive unit 30 on the Y1 side of a pair of drive units 30 adjacent in the direction Y and an end on the Y1 side of a drive unit 30 on the Y2 side of the pair of drive units 30 adjacent in the direction Y to each other on the X2 side. Consequently, a series of structures constituted by the U-shaped drive unit 30 and the connecting portion 31 connecting the drive units 30 to each other on the X2 side are repeated, whereby the drive portion 21 is formed to meander substantially in an S shape. The connecting portions 31 are examples of the "second connecting portion" in the present invention.

The drive units 30 each have a first drive portion 40 arranged on the side of the fixing frame 23 (Y1 side), a second drive portion 50 arranged on the side of the movable frame 16 (Y2 side), and a connecting portion 60 arranged on the X1 side, connecting the first drive portion 40 to the second drive portion 50. The first drive portion 40 and the second drive portion 50 each extend in the direction X to be formed in a rectangular shape and have substantially the same shape. The connecting portion 60 extends in the direction Y to be formed in a rectangular shape and connects an end on the X1 side of the first drive portion 40 to an end on the X1 side of the second drive portion 50. The first drive portion 40 and the second drive portion 50 each have a width W1 of at least about 20 µm and not more than about 500 µm in the direction Y. The connecting portion 60 is an example of the "first connecting portion" in the present invention.

According to the first embodiment, the first drive portion 40 is divided in a substantially central portion in the direction X to have a first drive section 41 and a second drive section 42 each extending in the direction X to be formed in a rectangular shape and a non-drive section 43 formed in a central portion between the first drive section 41 and the second drive section 42, not directly contributing to deformation. Similarly, the second drive portion 50 is divided in a substantially central portion in the direction X to have a third drive section 51 and a fourth drive section 52 each extending in the direction X to be formed in a rectangular shape and a non-drive section 53 formed in a central portion between the third drive section 51 and the fourth drive section 52, not directly contributing to deformation.

The first drive section 41 and the second drive section 42 are formed on the X2 side and the X1 side of the first drive portion 40, respectively. The third drive section 51 and the fourth drive section 52 are formed on the X1 side and the X2 side of the second drive portion 50, respectively. The second drive section 42 and the third drive section 51 are connected to each other through the connecting portion 60 on the X1 side.

The first drive section 41, the second drive section 42, the third drive section 51, and the fourth drive section 52 have substantially the same length L3 in the direction X and have substantially the same width W1 in the direction Y. The non-drive sections 43 and 53 have substantially the same length L4 in the direction X and have substantially the same width W1 in the direction Y. The non-drive sections 43 and 53 are configured such that the lengths L4 thereof in the direction X are at least about 10 µm and not more than about 100 µm. In other words, the non-drive sections 43 and 53 are configured such that the lengths L4 (at least about 10 µm and not more than about 100 µm) thereof in the direction X are smaller than the widths W1 (at least about 20 µm and not more than about 500 µm) of the first drive portion 40 and the second drive portion 50. The non-drive sections 43 and 53 are provided to ensure insulation between the first drive section 41 and the second drive section 42 and insulation between the third drive section 51 and the fourth drive section 52, respectively. The length L4 is an example of the "first distance" or the "second distance" in the present invention.

Figure 4:
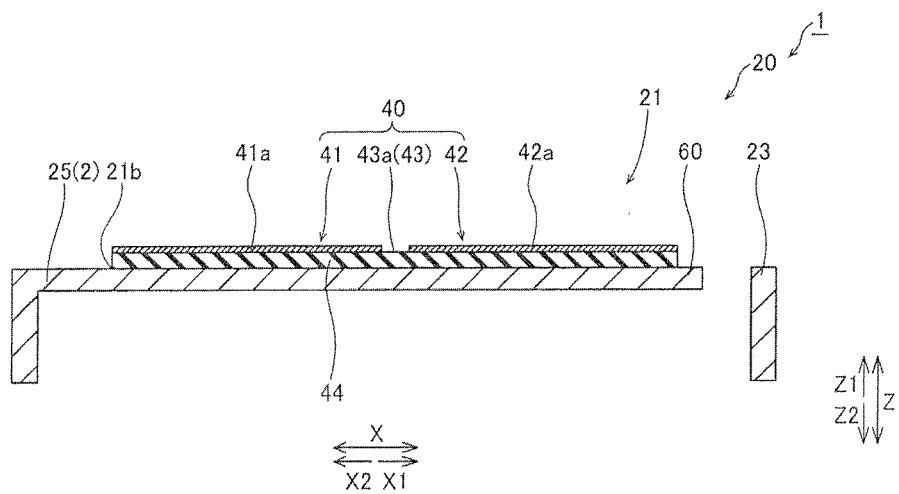
FIG. 4 A sectional view taken along the line 600-600 in FIG. 3.

As shown in FIG. 4, a piezoelectric body 44 deforming in the direction Z by voltage application is formed on a substantially entire upper surface (surface on the Z1 side) of the base material 2 in the first drive portion 40. On the X2 side of the upper surface of the piezoelectric body 44 of the first drive portion 40, a first drive electrode 41a is provided, and on the X1 side thereof, a second drive electrode 42a is provided. In a central portion between the first drive electrode 41a and the second drive electrode 42a, a section 43a formed with no electrode corresponding to the non-drive section 43 is provided. Thus, the first drive electrode 41a and the second drive electrode 42a are electrically independent of each other. The first drive section 41 is constituted by the base material 2, the piezoelectric body 44, and the first drive electrode 41a, and the second drive section 42 is constituted by the base material 2, the piezoelectric body 44, and the second drive electrode 42a.

Figure 5:
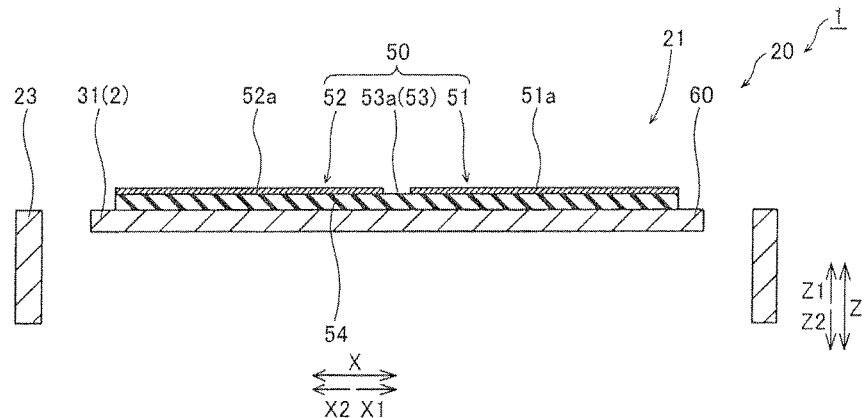
FIG. 5 A sectional view taken along the line 700-700 in FIG. 3.

Similarly, a piezoelectric body 54 deforming in the direction Z by voltage application is formed on a substantially entire upper surface (surface on the Z1 side) of the base material 2 in the second drive portion 50, as shown in FIG. 5. On the X1 side of the upper surface of the piezoelectric body 54 of the second drive portion 50, a third drive electrode 51a is provided, and on the X2 side thereof, a fourth drive electrode 52a is provided. In a central portion between the third drive electrode 51a and the fourth drive electrode 52a, a section 53a formed with no electrode corresponding to the non-drive section 53 is provided. Thus, the third drive electrode 51a and the fourth drive electrode 52a are electrically independent of each other. The third drive section 51 is constituted by the base material 2, the piezoelectric body 54, and the third drive electrode 51a, and the fourth drive section 52 is constituted by the base material 2, the piezoelectric body 54, and the fourth drive electrode 52a. The piezoelectric bodies 44 and 54 both are made of lead zirconate titanate (PZT).

According to the first embodiment, the first drive electrode 41a, the second drive electrode 42a, the third drive electrode 51a, and the fourth drive electrode 52a of the drive unit 30 are connected to wires 108a, 108b, 108c, and 108d connected to the control portion 102, respectively, as shown in FIG. 1, whereby direct-current voltages different from each other are applied to the first drive electrode 41a, the second drive electrode 42a, the third drive electrode 51a, and the fourth drive electrode 52a. Thus, the first drive section 41, the second drive section 42, the third drive section 51, and the fourth drive section 52 (see FIG. 2) are controlled for driving independently of each other. Furthermore, the direct-current voltages are applied to the first drive section 41, the second drive section 42, the third drive section 51, and the fourth drive section 52, whereby the drive portion 21 (see FIG. 2) performs non-resonant drive.

As shown in FIGS. 4 and 5, the first drive section 41, the second drive section 42, the third drive section 51, and the fourth drive section 52 (see FIG. 2) are configured to be deformed convexly to the Z1 side when a direct-current voltage (positive voltage) for elongating the piezoelectric bodies 44 and 54 is applied. On the other hands, the first drive section 41, the second drive section 42, the third drive section 51, and the fourth drive section 52 are configured to be deformed convexly to the Z2 side (concavely to the Z1 side) when a direct-current voltage (negative voltage) for contracting the piezoelectric bodies 44 and 54 is applied. Thus, as shown in FIG. 2, the first drive section 41, the second drive section 42, the third drive section 51, and the fourth drive section 52 are driven, whereby the first end 21a of the drive portion 21 is displaced with respect to the second end 21b, and the movable frame 16 (light scanning portion 10) is inclined.

Drive control of the laser scanning portion 1 (shake correcting portion 20) according to the first embodiment of the present invention is now described with reference to FIGS. 2 and 4 to 16.

First, drive control of the laser scanning portion 1 (shake correcting portion 20) in the inclination of the light scanning portion 10 about the rotation axis line A1 is described with reference to FIGS. 2 and 4 to 9.

Figure 6:
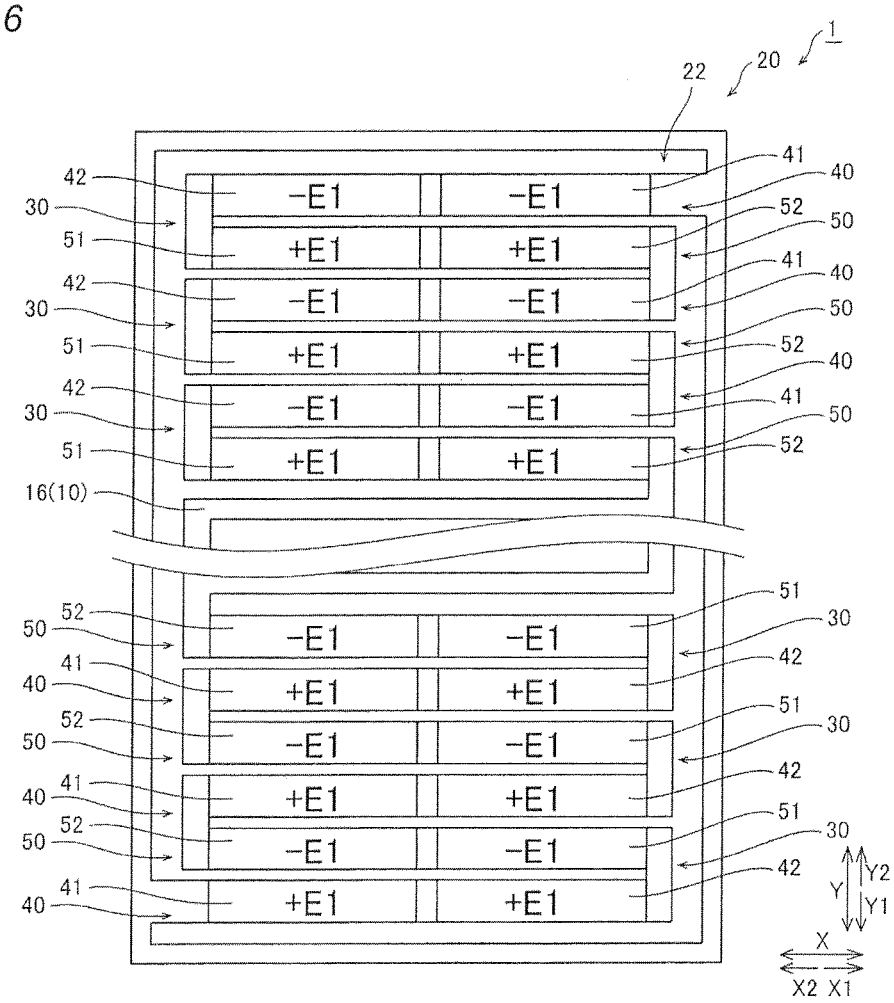
FIG. 6 A schematic view showing control of voltage application in the laser scanning portion in the inclination about a rotation axis line A1 of a light scanning portion according to the first embodiment of the present invention.

When the movable frame 16 is inclined about the rotation axis line A1 (see FIGS. 2, 8, and 9), in the drive portion 21 on the Y1 side of the shake correcting portion 20, control of applying a direct-current voltage (positive voltage) for elongating the piezoelectric body 44 (see FIG. 4) of a prescribed magnitude (+E1) to first drive sections 41 and second drive sections 42 is performed while control of applying a direct-current voltage (negative voltage) for contracting the piezoelectric body 54 (see FIG. 5) of a prescribed magnitude (−E1) to third drive sections 51 and fourth drive sections 52 is performed, as shown in FIG. 6. −E1 is equal in magnitude to +E1 (absolute value E1).

Thus, in the first drive portion 40 of the drive portion 21, an end on the X1 side of the second drive section 42 is inclined by rotating in a direction B1 with respect to an end on the X2 side of the first drive section 41 such that the end on the X1 side of the second drive section 42 is located below (Z2 side) the end on the X2 side of the first drive section 41, as shown in FIG. 7. An end on the X2 side of the fourth drive section 52 is inclined by rotating in the direction B1 with respect to an end on the X2 side of the third drive section 51 such that the end on the X2 side of the fourth drive section 52 is located above (Z1 side) an end on the X1 side of the third drive section 51.

The end on the X1 side of the third drive section 51 can maintain the inclination of the end on the X1 side of the second drive section 42, whereby the end on the X2 side of the fourth drive section 52 is inclined by rotating in the direction B1 such that the end on the X2 side of the fourth drive section 52 is located above the end on the X2 side of the first drive section 41 and the inclinations of the first drive portion 40 and the second drive portion 50 are accumulated.

As shown in FIG. 8, in the drive portion 21, the three drive units 30 are driven in the same manner. Thus, in a drive unit 30 connected to the movable frame 16, the end on the X2 side of the fourth drive section 52 (the first end 21a of the drive portion 21) is inclined by rotating in the direction B1 such that the end on the X2 side of the fourth drive section 52 is located above the end on the X1 side of the third drive section 51 and the inclinations of the three drive units 30 are accumulated.

On the other hand, in the drive portion 22 on the Y2 side of the shake correcting portion 20, drive control is performed such that the driving state is opposite to that of the drive portion 21 on the Y1 side, as shown in FIG. 6. Specifically, control of applying a voltage of −E1 to first drive sections 41 and second drive sections 42 is performed, and control of applying a voltage of +E1 to third drive sections 51 and fourth drive sections 52 is performed. Thus, the drive portion 22 is driven (inclined) oppositely to the drive portion 21, as shown in FIG. 9, and in a drive unit 30 connected to the movable frame 16, an end on the X1 side of a fourth drive section 52 (the first end 22a of the drive portion 22) is inclined such that the end on the X1 side of the fourth drive section 52 is located below an end on the X2 side of a third drive section 51 and the inclinations of three drive units 30 are accumulated.

Consequently, the X2 side of the movable frame 16 is located above in a state where the inclinations of the three drive units 30 of the drive portion 21 are accumulated while the X1 side of the movable frame 16 is located below in a state where the inclinations of the three drive units 30 of the drive portion 22 are accumulated, whereby the movable frame 16 is inclined by rotating in the direction B1 about the rotation axis line A1.

In the drive portions 21 and 22, control opposite to the aforementioned drive control is performed, whereby the movable frame 16 is inclined by rotating in a direction opposite to the direction B1 about the rotation axis line A1.

Next, drive control of the laser scanning portion 1 (shake correcting portion 20) in the inclination of the light scanning portion 10 about the rotation axis line A2 is described with reference to FIGS. 2 and 10 to 14.

Figure 10:
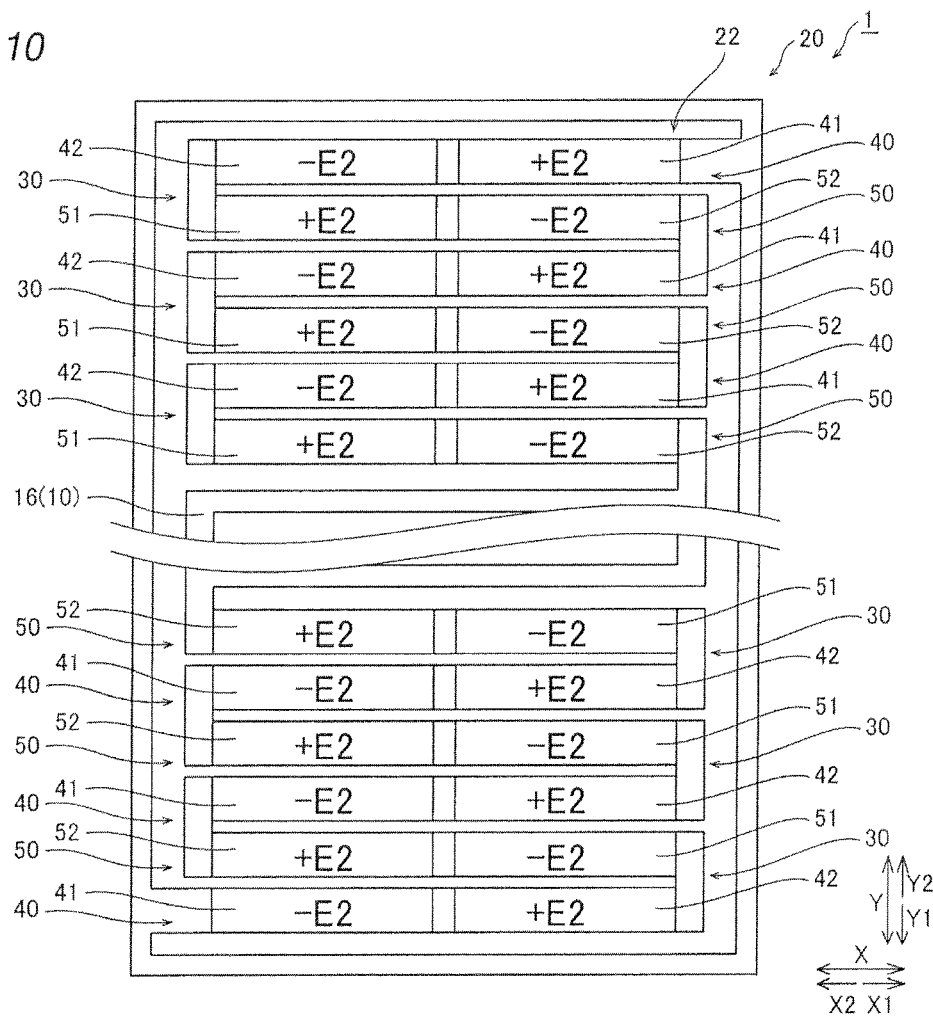
FIG. 10 A schematic view showing control of voltage application in the laser scanning portion in the inclination about a rotation axis line A2 of the light scanning portion according to the first embodiment of the present invention.

When the movable frame 16 is inclined about the rotation axis line A2 (see FIGS. 2 and 14), in the drive portion 21 on the Y1 side of the shake correcting portion 20, control of applying a negative voltage of a prescribed magnitude (−E2) to the first drive sections 41 and the third drive sections 51 is performed, and control of applying a positive voltage of a prescribed magnitude (+E2) to the second drive sections 42 and the fourth drive sections 52 is performed, as shown in FIG. 10.

Figure 11:
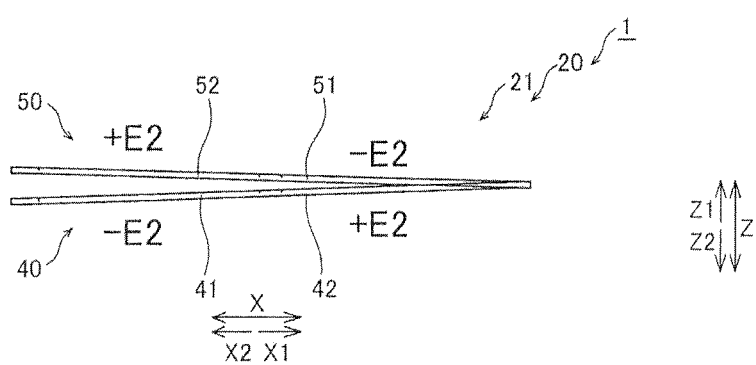
FIG. 11 A side elevational view showing drive control of the drive unit in the inclination about the rotation axis line A2 of the light scanning portion according to the first embodiment of the present invention.

Thus, in the first drive portion 40 of the drive portion 21, the end on the X1 side of the second drive section 42 is located above (Z1 side) the end on the X2 side of the first drive section 41 substantially in an uninclined state, as shown in FIG. 11. The end on the X2 side of the fourth drive section 52 is located above the end on the X1 side of the third drive section 51 substantially in an uninclined state. Thus, the end on the X2 side of the fourth drive section 52 is located above the end on the X2 side of the first drive section 41 in a state where upward movements of the first drive portion 40 and the second drive portion 50 are accumulated.

Figure 12:
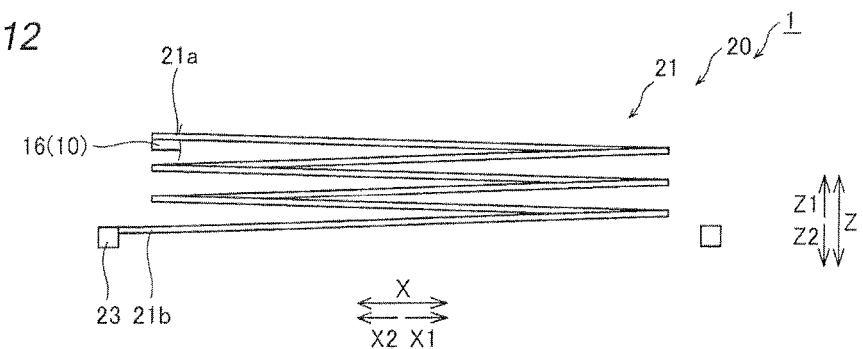
FIG. 12 A side elevational view showing the driving of one drive portion in the inclination about the rotation axis line A2 of the light scanning portion according to the first embodiment of the present invention.

As shown in FIG. 12, in the drive portion 21, the three drive units 30 are driven in the same manner. Thus, the end on the X2 side of the fourth drive section 52 (the first end 21a of the drive portion 21) in the drive unit 30 connected to the movable frame 16 is located above an end on the X1 side of the first drive section 41 (the second end 21b of the drive portion 21) in a drive unit 30 connected to the fixing frame 23 in a state where upward movements of the three drive units 30 are accumulated.

Figure 13:
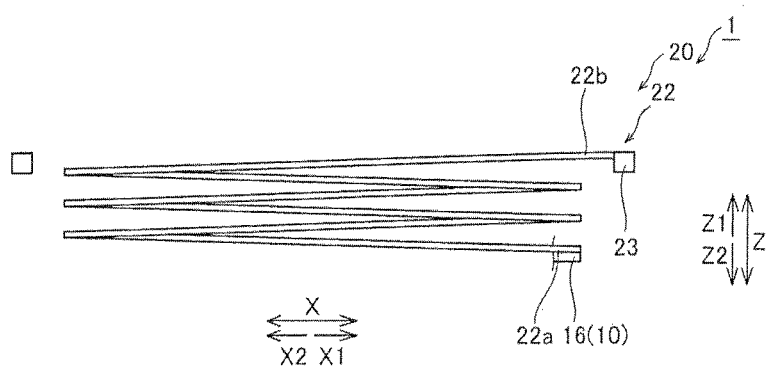
FIG. 13 A side elevational view showing the driving of the other drive portion in the inclination about the rotation axis line A2 of the light scanning portion according to the first embodiment of the present invention.

On the other hand, in the drive portion 22, drive control is performed such that the driving state is opposite to that of the drive portion 21, as shown in FIG. 10. Specifically, control of applying a voltage of +E2 to the first drive sections 41 and the third drive sections 51 is performed, and control of applying a voltage of −E2 to the second drive sections 42 and the fourth drive sections 52 is performed. Thus, the drive portion 22 is driven (movements are accumulated) oppositely to the drive portion 21, as shown in FIG. 13, and an end on the X2 side of the fourth drive section 52 (the first end 22a of the drive portion 22) in the drive unit 30 connected to the movable frame 16 is located below an end on the X1 side of a first drive section 41 (the second end 22b of the drive portion 22) in a drive unit 30 connected to the fixing frame 23 in a state where downward (Z2 side) movements of the three drive units 30 are accumulated.

Figure 14:
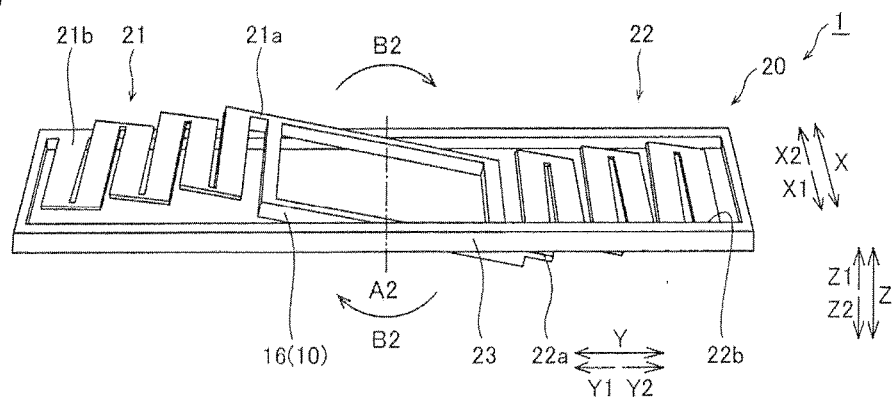
FIG. 14 A perspective view showing the laser scanning portion in the inclination about the rotation axis line A2 of the light scanning portion according to the first embodiment of the present invention.

Consequently, the Y2 side of the movable frame 16 is located above in a state where upward movements of the three drive units 30 are accumulated while the Y1 side of the movable frame 16 is located below in the state where the downward movements of the three drive units 30 are accumulated, as shown in FIG. 14, whereby the movable frame 16 is inclined by rotating in a direction B2 about the rotation axis line A2.

In the drive portions 21 and 22, control opposite to the aforementioned drive control is performed, whereby the movable frame 16 is inclined by rotating in a direction opposite to the direction B2 about the rotation axis line A2.

Next, drive control of the laser scanning portion 1 (shake correcting portion 20) in the inclination of the light scanning portion 10 in the biaxial direction is described with reference to FIGS. 2, 6, 10, 15, and 16.

Figure 15:
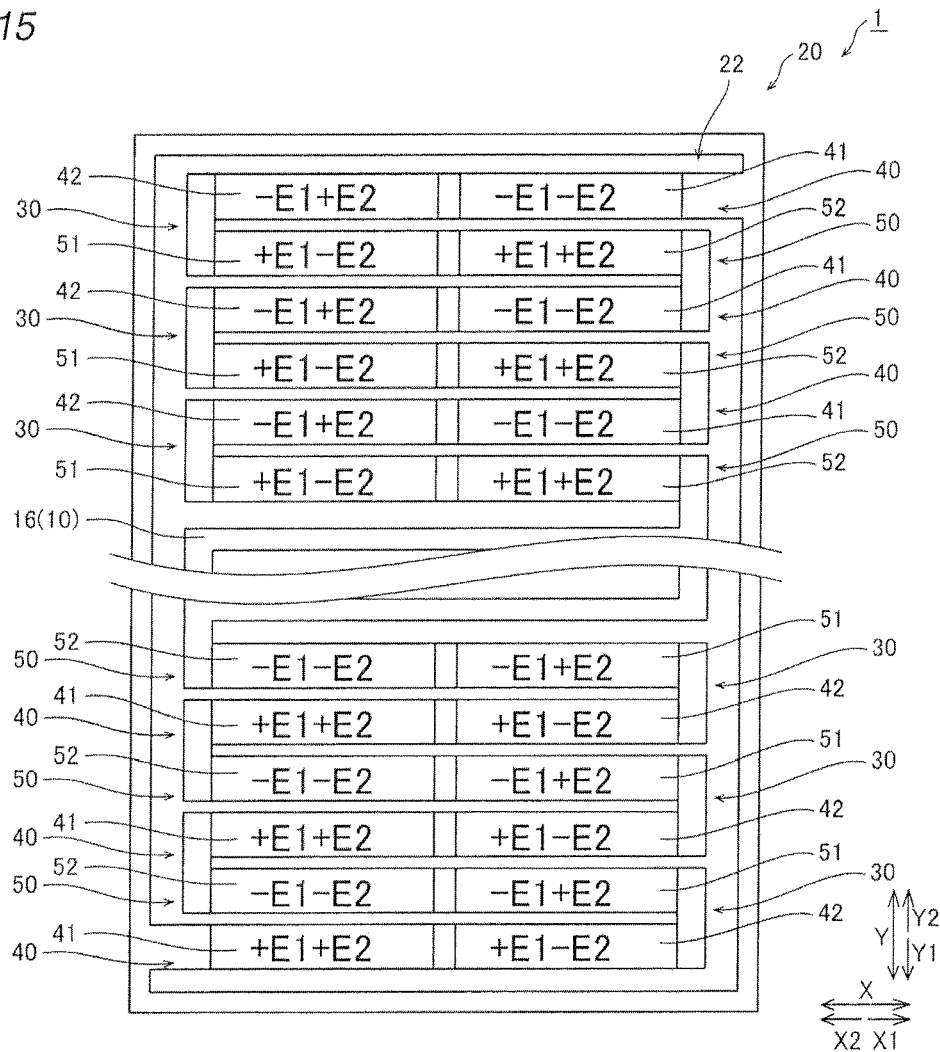
FIG. 15 A schematic view showing control of voltage application in the laser scanning portion in the inclination in a biaxial direction of the light scanning portion according to the first embodiment of the present invention.

When the movable frame 16 is inclined in the biaxial direction about the rotation axis line A1 and the rotation axis line A2 (see FIGS. 2 and 16), control of applying a combination of a voltage used to incline the movable frame 16 about the rotation axis line A1 shown in FIG. 6 and a voltage used to incline the movable frame 16 about the rotation axis line A2 shown in FIG. 10 is performed, as shown in FIG. 15. In the drive portion 21, for example, control of applying a voltage (+E1+E2) obtained by combining +E1 and +E2 to the first drive sections 41 is performed, control of applying a voltage (+E1−E2) obtained by combining +E1 and −E2 to the second drive sections 42 is performed, control of applying a voltage (−E1+E2) obtained by combining −E1 and +E2 to the third drive sections 51 is performed, and control of applying a voltage (−E1−E2) obtained by combining −E1 and −E2 to the fourth drive sections 52 is performed.

In the drive portion 22, on the other hand, drive control is performed such that the driving state is opposite to that of the drive portion 21. Specifically, control of applying a voltage (−E1−E2) to the first drive sections 41 is performed, control of applying a voltage (−E1+E2) to the second drive sections 42 is performed, control of applying a voltage (+E1−E2) to the third drive sections 51 is performed, and control of applying a voltage (+E1+E2) to the fourth drive sections 52 is performed.

Figure 16:
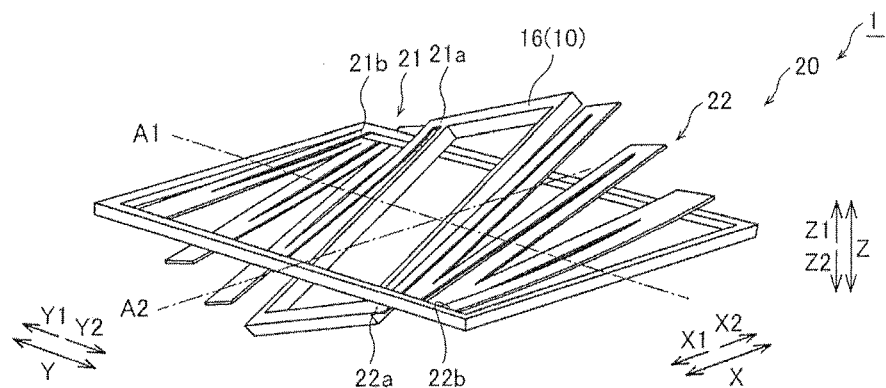
FIG. 16 A perspective view showing the laser scanning portion in the inclination in the biaxial direction of the light scanning portion according to the first embodiment of the present invention.

Thus, the movable frame 16 is inclined by rotating in the biaxial direction about the rotation axis line A1 and the rotation axis line A2 such that the X2-Y2 side of the movable frame 16 is located uppermost (Z1 side) and the X1-Y1 side of the movable frame 16 is located lowermost (Z2 side), as shown in FIG. 16.

In the drive portions 21 and 22, control opposite to the aforementioned drive control is performed, whereby the movable frame 16 is inclined by rotating in the biaxial direction such that the X1-Y1 side of the movable frame 16 is located uppermost and the X1-Y1 side of the movable frame 16 is located lowermost.

When the movable frame 16 is inclined by rotating in the biaxial direction such that the X2-Y1 side of the movable frame 16 is located uppermost and the X2-Y1 side of the movable frame 16 is located lowermost, in the drive portion 21, control of applying a voltage (+E1−E2) to the first drive sections 41 is performed, control of applying a voltage (+E1+E2) to the second drive sections 42 is performed, control of applying a voltage (−E1−E2) to the third drive sections 51 is performed, and control of applying a voltage (−E1+E2) to the fourth drive sections 52 is performed. In the drive potion 22, drive control is performed such that the driving state is opposite to that of the drive portion 21.

When the movable frame 16 is inclined by rotating in the biaxial direction such that the X1-Y2 side of the movable frame 16 is located uppermost and the X1-Y2 side of the movable frame 16 is located lowermost, in the drive portion 21, control of applying a voltage (−E1+E2) to the first drive sections 41 is performed, control of applying a voltage (−E1−E2) to the second drive sections 42 is performed, control of applying a voltage (+E1+E2) to the third drive sections 51 is performed, and control of applying a voltage (+E1−E2) to the fourth drive sections 52 is performed. In the drive potion 22, drive control is performed such that the driving state is opposite to that of the drive portion 21.

According to the first embodiment, as hereinabove described, the first drive sections 41, the second drive sections 42, the third drive sections 51, and the fourth drive sections 52 are configured to be controlled for driving independently of each other to incline the light scanning portion 10, whereby the different driving states of the first drive sections 41, the second drive sections 42, the third drive sections 51, and the fourth drive sections 52 controllable for driving differently can be combined, and hence the driving state of the first drive portion 40 and the driving state of the second drive portion 50 can be differentiated. Thus, the light scanning portion 10 can be inclined not only about a uniaxial rotation axis line but also in the biaxial direction about the rotation axis line A1 and the rotation axis line A2, unlike the case where the driving state of the first drive portion 40 and the driving state of the second drive portion 50 are the same. Thus, the light scanning portion 10 inclinable in the biaxial direction can scan the laser beam, and hence the scanning position of the laser beam can be adjusted precisely in the portable electronic device 100 having a projector function. No drive portion dedicated for inclining the light scanning portion 10 about each of the rotation axis line A1 and the rotation axis line A2 may be provided, and hence the portable electronic device 100 including the laser scanning portion 1 can be downsized.

According to the first embodiment, as hereinabove described, the first drive sections 41, the second drive sections 42, the third drive sections 51, and the fourth drive sections 52 are controlled for driving independently of each other to be capable of inclining the movable frame 16 (light scanning portion 10) in the biaxial direction about the rotation axis line A1 extending in the direction Y and the rotation axis line A2 extending in the direction X (direction orthogonal to the direction Y in the same plane). Thus, drive control for inclination about the rotation axis line A1 and the drive control for inclination about the rotation axis line A2 can be substantially independent of each other, and the light scanning portion 10 can be easily inclined in the biaxial direction by combining the inclination about the rotation axis line A1 and the inclination about the rotation axis line A2.

According to the first embodiment, as hereinabove described, in the drive portion 21, control of applying the voltage (+E1) to the first drive sections 41 and the second drive sections 42 is performed and control of applying the voltage (−E1) to the third drive sections 51 and the fourth drive sections 52 is performed to incline the movable frame 16 about the rotation axis line A1. Thus, systems of drive control are consolidated into two, so that the light scanning portion 10 can be inclined about the rotation axis line A1 by simple drive control, as compared with the case where drive control of driving the first drive sections 41, the second drive sections 42, the third drive sections 51, and the fourth drive sections 52 completely independently of each other is performed.

According to the first embodiment, as hereinabove described, in the drive portion 21, control of applying the voltage (−E2) to the first drive sections 41 and the third drive sections 51 is performed and control of applying the voltage (+E2) to the second drive sections 42 and the fourth drive sections 52 is performed to incline the movable frame 16 about the rotation axis line A2, whereby systems of drive control are consolidated into two, so that the light scanning portion 10 can be inclined about the rotation axis line A2 by simple drive control, as compared with the case where drive control of driving the first drive sections 41, the second drive sections 42, the third drive sections 51, and the fourth drive sections 52 completely independently of each other is performed.

According to the first embodiment, as hereinabove described, control of applying the combination of the voltage used to incline the movable frame 16 about the rotation axis line A1 and the voltage used to incline the movable frame 16 about the rotation axis line A2 to the first drive sections 41, the second drive sections 42, the third drive sections 51, and the fourth drive sections 52 is performed to incline the movable frame 16 in the biaxial direction about the rotation axis line A1 and the rotation axis line A2. Thus, the light scanning portion 10 can be inclined in the biaxial direction about the rotation axis line A1 and the rotation axis line A2. Furthermore, the voltages different from each other are applied to first drive electrodes 41a, second drive electrodes 42a, third drive electrodes 51a, and fourth drive electrodes 52a, whereby the first drive sections 41, the second drive sections 42, the third drive sections 51, and the fourth drive sections 52 can be easily controlled for driving independently of each other.

According to the first embodiment, as hereinabove described, the first drive portion 40 is configured to have the first drive section 41 and the second drive section 42 formed by dividing the first drive portion 40 in the substantially central portion in the direction X, and the second drive portion 50 is configured to have the third drive section 51 and the fourth drive section 52 formed by dividing the second drive portion 50 in the substantially central portion in the direction X. Thus, the driving states of the first drive portion 40 and the second drive portion 50 can be differentiated in the substantially central portions of the first drive portion 40 and the second drive portion 50, and hence the first drive portion 40 and the second drive portion 50 can be more stably driven, as compared with the case where the first drive portion 40 and the second drive portion 50 are divided at positions distanced from the central portions. Thus, the inclination of the light scanning portion 10 can be reliably controlled.

According to the first embodiment, as hereinabove described, the first drive sections 41, the second drive sections 42, the third drive sections 51, and the fourth drive sections 52 are formed to have substantially the same length L3 in the direction X, whereby the drive characteristics of the first drive sections 41, the second drive sections 42, the third drive sections 51, and the fourth drive sections 52 can be rendered substantially the same, and hence the first drive portion 40 and the second drive portion 50 can be more stably driven. Thus, the inclination of the light scanning portion 10 can be more reliably controlled.

According to the first embodiment, as hereinabove described, the lengths L4 (at least about 10 μm and not more than about 100 μm) of the non-drive sections 43 and 53 in the direction X are rendered smaller than the widths W1 (at least about 20 μm and not more than about 500 μm) of the first drive portion 40 and the second drive portion 50, whereby a region for forming the first drive section 41 and the second drive section 42 can be sufficiently ensured in the first drive portion 40, and a region for forming the third drive section 51 and the fourth drive section 52 can be sufficiently ensured in the second drive portion 50. Thus, the first drive sections 41, the second drive sections 42, the third drive sections 51, and the fourth drive sections 52 can be formed to such an extent to sufficiently ensure the inclination of the light scanning portion 10.

According to the first embodiment, as hereinabove described, the drive portions 21 and 22 are provided to hold the light scanning portion 10 therebetween, whereby the light scanning portion 10 can be greatly inclined by combining the driving states of the drive portions 21 and 22. Furthermore, the drive portions 21 and 22 are formed to be substantially point-symmetric to each other, using the center R of the mirror portion 11 of the light scanning portion 10 as the symmetric point, whereby the drive characteristics of the drive portions 21 and 22 can be rendered substantially the same, and hence the inclination of the light scanning portion 10 can be easily controlled, as compared with the case where the drive portions 21 and 22 are not symmetric to each other.

According to the first embodiment, as hereinabove described, drive control is performed such that the driving state is opposite to that of the drive portion 21 on the Y1 side of the shake correcting portion 20 in the drive portion 22 on the Y2 side of the shake correcting portion 20, whereby the light scanning portion 10 can be easily inclined in the biaxial direction by combining the different driving states of the drive portions 21 and 22 that are substantially point-symmetric to each other.

According to the first embodiment, as hereinabove described, in each of the drive portions 21 and 22, the three drive units 30 and the two connecting portions 31 are connected to each other, whereby the light scanning portion 10 can be more greatly inclined in the biaxial direction by combining the driving states of the three drive units 30. Furthermore, the drive portions 21 and 22 are formed to meander substantially in the S shape, whereby the entire lengths of the drive portions 21 and 22 can be sufficiently ensured while an excessive increase in the lengths of the drive portions 21 and 22 in only one of the direction X and the direction Y is suppressed.

According to the first embodiment, as hereinabove described, the resonant drive portions 12 of the light scanning portion 10 are configured to resonate the mirror portion 11 to oscillate the same, whereby the light scanning portion 10 can scan a larger range. Furthermore, the drive portion 21 is configured to perform non-resonant drive, whereby difficulty in drive control of the drive portion 21 can be suppressed, as compared with the case where the drive portion 21 performs resonant drive, and the inclined state of the light scanning portion 10 can be easily maintained.

According to the first embodiment, as hereinabove described, the control portion 102 is configured to adjust the position of the picture projected by the laser scanning portion 1 by inclining the light scanning portion 10 of the laser scanning portion 1 in the biaxial direction in the direction opposite to the motion direction of the vibration resulting from the shake detected by the acceleration sensor 107, whereby the blurring of the picture is suppressed, and hence the shake can be reliably corrected in the portable electronic device 100 having a projector function.

Second Embodiment

A second embodiment of the present invention is now described with reference to FIGS. 17 to 19. In this second embodiment, the case where a fixing frame 223 located in a central portion is fixed and a movable frame 226 arranged to surround drive portions 21 and 22 is movable in a shake correcting portion 220 of a laser scanning portion 201 is described, unlike in the aforementioned first embodiment. The laser scanning portion 201 is an example of the "MEMS device" in the present invention.

Figure 17:
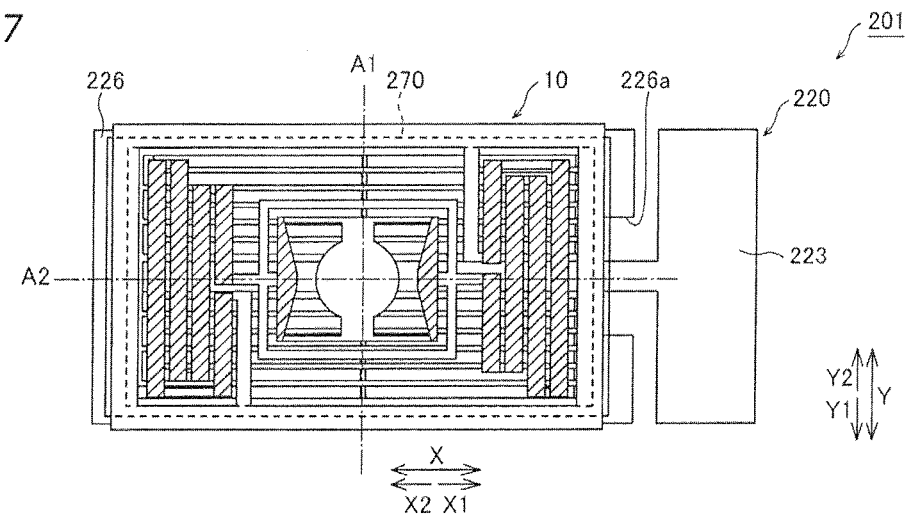
FIG. 17 A plan view showing a laser scanning portion according to a second embodiment of the present invention.

The laser scanning portion 201 according to the second embodiment of the present invention includes a light scanning portion 10, the shake correcting portion 220 arranged below (Z2 side, see FIG. 19) the light scanning portion 10, and a spacer 270 arranged to be held between the movable frame 226 described later and the light scanning portion 10, connecting the movable frame 226 to the light scanning portion 10, as shown in FIG. 17. The spacer 270 is formed in a frame shape in a plan view and has a function of providing the light scanning portion 10 in the movable frame 226 of the shake correcting portion 220 in a stacked arrangement in a state where the shake correcting portion 220 and the light scanning portion 10 are separated from each other in a vertical direction (direction Z, see FIG. 19) at a height position where the drive portions 21 and 22 of the shake correcting portion 220 and the light scanning portion 10 are not in contact with each other.

Figure 18:
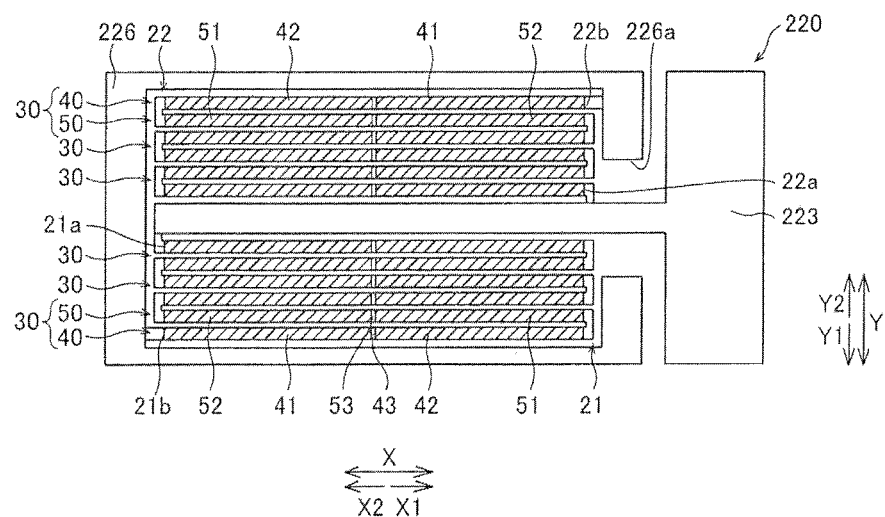
FIG. 18 A plan view showing a shake correcting portion according to the second embodiment of the present invention.

The shake correcting portion 220 includes a pair of drive portions 21 and 22, the fixing frame 223 arranged to be held between the pair of drive portions 21 and 22, and the movable frame 226 arranged to surround the pair of drive portions 21 and 22, as shown in FIG. 18. The fixing frame 223 has a T shape and is formed to extend in the longitudinal direction (direction X) of the shake correcting portion 220 in a central portion in the short-side direction (direction Y) of the shake correcting portion 220 and extend in the direction Y on one side (X1 side) in the direction X. The fixing frame 223 is fixed to a fixing section (unshown) of a portable electronic device. The movable frame 226 is formed in a frame shape and is formed with an opening 226a on the X1 side. A section of the fixing frame 223 extending in the direction X is inserted into a region surrounded by the movable frame 226 through this opening 226a. The fixing frame 223 and the movable frame 226 are examples of the "fixing portion" and the "movable portion" in the present invention, respectively.

A first end 21a on the Y2 side of the drive portion 21 is connected to an end on the X2 side of the fixing frame 223, and a second end 21b on the Y1 side of the drive portion 21 is connected to the vicinity of a corner on the X2 side and the Y1 side of the movable frame 226. A first end 22a on the Y1 side of the drive portion 22 is connected to the fixing frame 223 in the vicinity of the opening 226a, and a second end 22b on the Y2 side of the drive portion 21 is connected to the vicinity of a corner on the X1 side and the Y2 side of the movable frame 226. Thus, both the first end 21a of the drive portion 21 and the first end 22a of the drive portion 22 are fixed to the fixing frame 223, and both the second end 21b of the drive portion 21 and the second end 22b of the drive portion 22 are connected to the movable frame 226.

Figure 19:
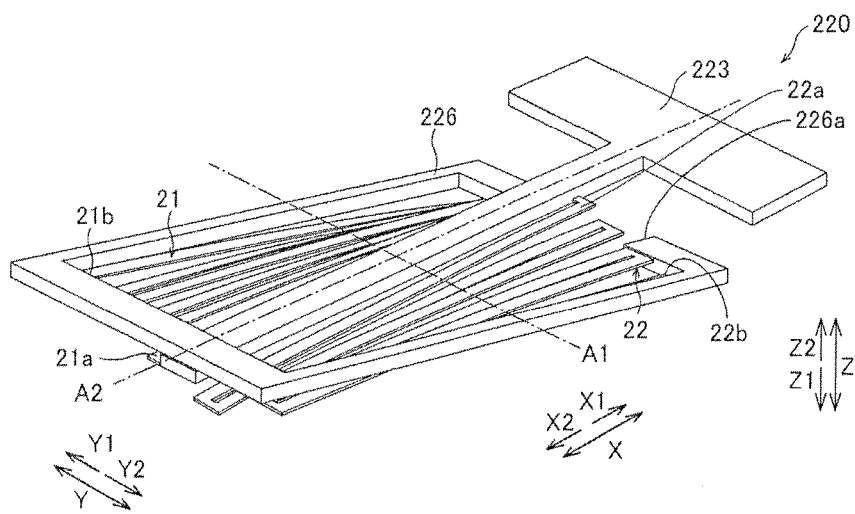
FIG. 19 A perspective view showing the inclination of the shake correcting portion according to the second embodiment of the present invention.

Thus, first drive sections 41, second drive sections 42, third drive sections 51, and fourth drive sections 52 of the drive portions 21 and 22 are controlled for driving independently of each other, whereby the movable frame 226 is inclined in a biaxial direction about a rotation axis line A1 and a rotation axis line A2, as shown in FIG. 19. Consequently, the light scanning portion 10 connected to the movable frame 226 through the spacer 270 can be inclined in the biaxial direction. The remaining structure and a method for drive control according to the second embodiment of the present invention are similar to those according to the aforementioned first embodiment.

According to the second embodiment, as hereinabove described, the first drive sections 41, the second drive sections 42, the third drive sections 51, and the fourth drive sections 52 are controlled for driving independently of each other to incline the light scanning portion 10, whereby the light scanning portion 10 can be inclined in the biaxial direction about the rotation axis line A1 and the rotation axis line A2.

According to the second embodiment, as hereinabove described, the light scanning portion 10 is provided in the movable frame 226 of the shake correcting portion 220 in the stacked arrangement in the state where the shake correcting portion 220 and the light scanning portion 10 are separated from each other in the vertical direction through the spacer 270 at the height position where the drive portions 21 and 22 of the shake correcting portion 220 and the light scanning portion 10 are not in contact with each other. Thus, the light scanning portion 10 and the shake correcting portion 220 can be provided in the stacked arrangement in the vertical direction (direction Z), and hence an increase in the size of the laser scanning portion 201 in the direction X and the direction Y can be suppressed as compared with the case where the light scanning portion 10 and the shake correcting portion 220 are arranged in the same plane extending in the direction X and the direction Y. Furthermore, the light scanning portion 10 and the drive portions 21 and 22 can be separated from each other, and hence a deviation of the inclination of the light scanning portion 10 from an intended inclination resulting from contact of the light scanning portion 10 with the drive portions 21 and 22 can be suppressed. The remaining effects of the second embodiment of the present invention are similar to those of the aforementioned first embodiment.

Third Embodiment

Figure 20:
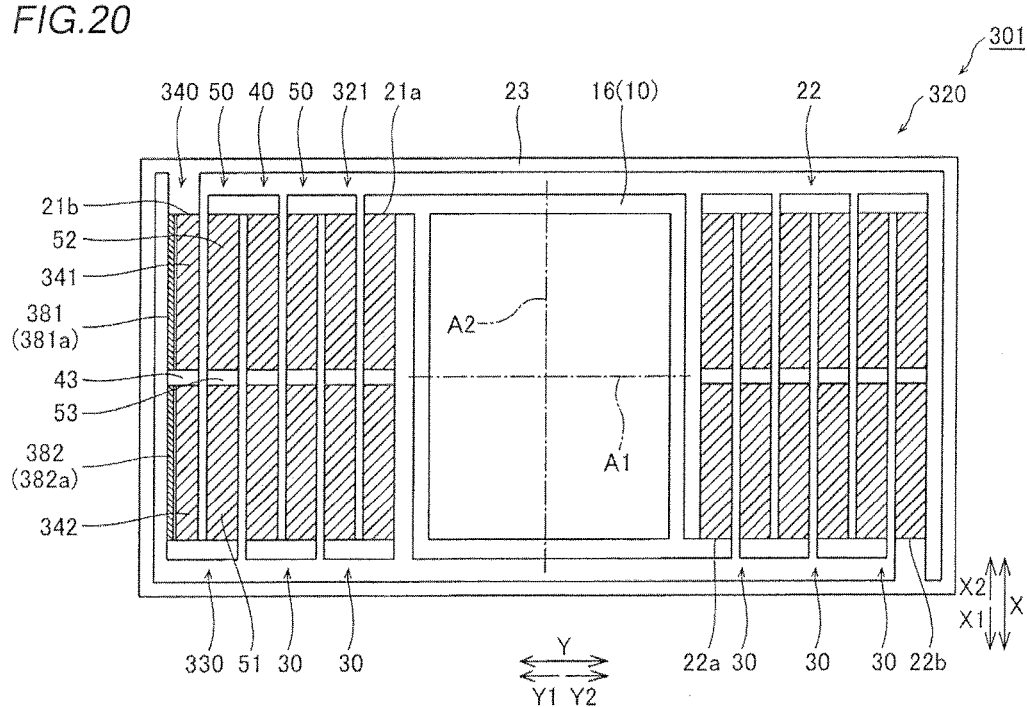
FIG. 20 A plan view showing a laser scanning portion according to a third embodiment of the present invention.

A third embodiment of the present invention is now described with reference to FIGS. 4 and 20. In this third embodiment, the case where detecting portions 381 and 382 are provided in a shake correcting portion 320 of a laser scanning portion 301 is described, unlike in the aforementioned first embodiment. The laser scanning portion 301 is an example of the "MEMS device" in the present invention.

A first drive portion 340 of a drive unit 330 where a second end 21b of a drive portion 321 is located in the drive portion 321 of the shake correcting portion 320 according to the third embodiment of the present invention is provided with the two detecting portions 381 and 382. Specifically, the first drive portion 340 is divided into four in a substantially central portion in a direction X on the side of a fixing frame 23 (Y1 side), whereby a detecting portion 381 is formed on the X2-Y1 side, and a detecting portion 382 is formed on the X1-Y1 side. The detecting portion 381 and the detecting portion 382 are formed, so that both a first drive section 341 formed on the X2-Y2 side and a second drive section 342 formed on the X1-Y2 side are reduced in size in a direction Y.

The detecting portions 381 and 382 are constituted by detection electrodes 381a and 382a formed on the upper surface of a piezoelectric body 44 (see FIG. 4). The detection electrodes 381a and 382a are configured to detect potential differences generated according to the amount of deformation of the piezoelectric body 44. Thus, the detecting portion 381 is configured to detect the amount of driving of the first drive section 341 according to the amount of deformation of the piezoelectric body 44, and the detecting portion 382 is configured to detect the amount of driving of the second drive section 342 according to the deformation of the piezoelectric body 44. The remaining structure and a method for drive control according to the third embodiment of the present invention are similar to those according to the aforementioned first embodiment.

According to the third embodiment, as hereinabove described, first drive sections 41 (341), second drive sections 42 (342), third drive sections 51, and fourth drive sections 52 are controlled for driving independently of each other to incline a light scanning portion 10, whereby the light scanning portion 10 can be inclined in biaxial direction about a rotation axis line A1 and a rotation axis line A2.

According to the third embodiment, as hereinabove described, the detecting portion 381 (detection electrode 381a) and the detecting portion 382 (detection electrode 382a) are provided, whereby the driving of the drive portion 321 can be more reliably controlled on the basis of detection results of the detection electrodes 381a and 382a. Furthermore, the detection electrodes 381a and 382a are provided in the first drive portion 340 of the drive unit 330 where the second end 21b of the drive portion 321 is located, whereby the detection electrodes 381a and 382a can be provided in the vicinity of the fixing frame 23, and hence wiring can be easily extended from the fixing frame 23 to the detection electrodes 381a and 382a. The remaining effects of the third embodiment of the present invention are similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

Figure 21:
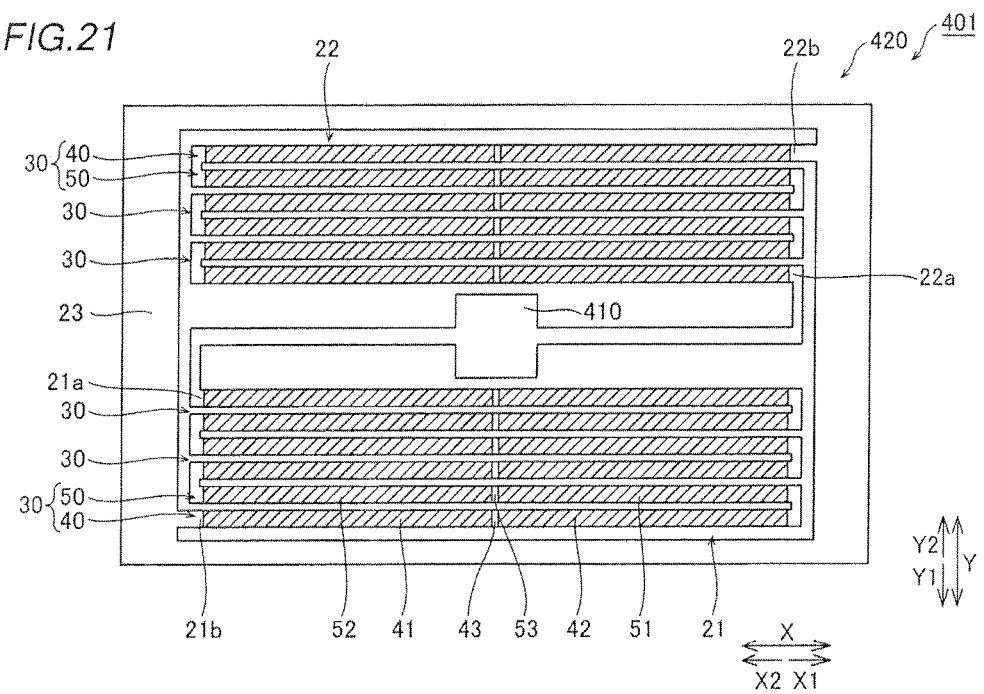
FIG. 21 A plan view showing a laser scanning portion according to a first modification of the present invention.

For example, while the example of employing the light scanning portion 10 capable of scanning the laser beam has been shown in each of the aforementioned first and second embodiments, the present invention is not restricted to this. For example, a mirror portion 410 capable of reflecting a laser beam may be arranged instead of the light scanning portion 10, as in a MEMS device 401 according to a first modification shown in FIG. 21. Thus, drive portions 21 and 22 of a shake correcting portion 420 are driven to incline a mirror portion 410 in a biaxial direction, whereby the laser beam can be reflected in a prescribed direction. The mirror portion 410 is an example of the "optical component" in the present invention. Alternatively, a lens capable of condensing light may be employed instead of the light scanning portion 10. Thus, a shake prevention function can be added to a portable electronic device having an imaging function.

Figure 22:
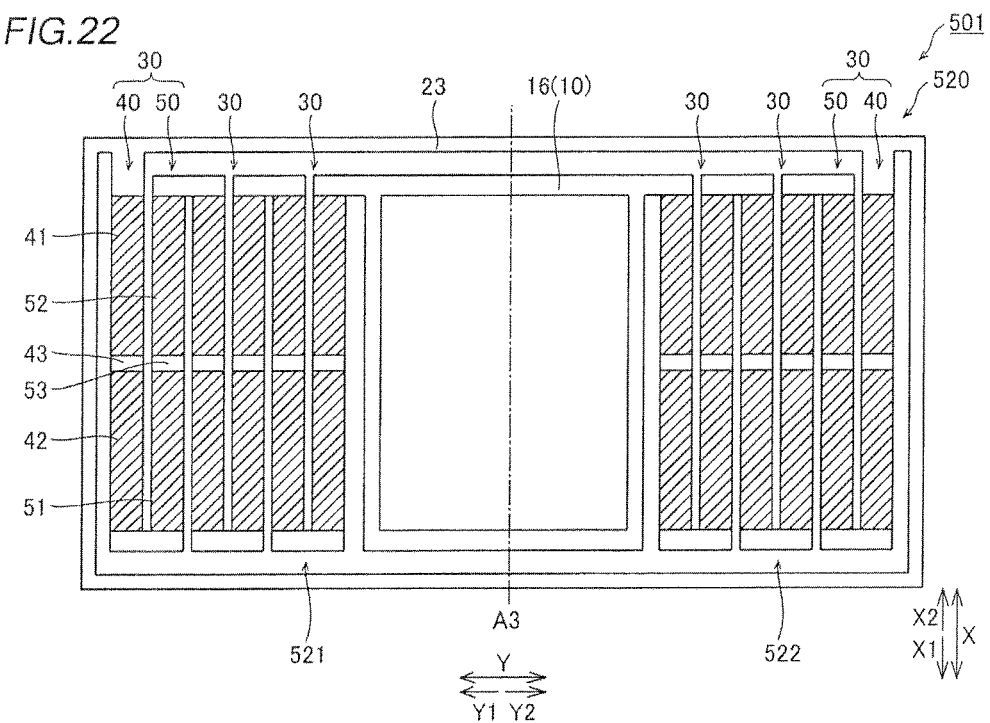
FIG. 22 A plan view showing a laser scanning portion according to a second modification of the present invention.

While the example of arranging the drive portions 21 and 22 to be substantially point-symmetric to each other, using the center R of the mirror portion 11 of the light scanning portion 10 as the symmetric point has been shown in the aforementioned first embodiment, the present invention is not restricted to this. For example, a drive portion 521 and a drive portion 522 may be arranged to be substantially line-symmetric (mirror-image symmetric) to each other, using a straight line A3 passing through a substantially central portion of a light scanning portion 10 (movable frame 16) and extending in a direction X as a symmetric line, as in a laser scanning portion 501 according to a second modification shown in FIG. 22. Also in this case, first drive sections 41, second drive sections 42, third drive sections 51, and fourth drive sections 52 of the drive portions 521 and 522 are controlled for driving, whereby the movable frame 16 (light scanning portion 10) can be inclined in a biaxial direction. The laser scanning portion 501 is an example of the "MEMS device" in the present invention.

While the example of providing the pair of drive portions 21 (321) and 22 has been shown in each of the aforementioned first to third embodiments of the present invention, the present invention is not restricted to this. According to the present invention, only one drive portion may be provided. Thus, the number of drive sections controlled for driving can be reduced, and hence the load on the drive portion can be reduced.

While the example of configuring the movable frame 16 (light scanning portion 10) to be inclinable in the biaxial direction about the rotation axis line A1 extending in the direction Y and the rotation axis line A2 extending in the direction X orthogonal to the direction Y in the same plane has been shown in the aforementioned first embodiment, the present invention is not restricted to this. According to the present invention, the extensional directions of the two rotation axis lines may not be orthogonal to each other in the same plane, so far as control of the inclination of the optical component in a biaxial direction is facilitated.

While the example of driving the first drive sections 41, the second drive sections 42, the third drive sections 51, and the fourth drive sections 52 by the piezoelectric bodies 44 and 54 deformed by voltage application has been shown in the aforementioned first embodiment, the present invention is not restricted to this. According to the present invention, the first drive sections, the second drive sections, the third drive sections, and the fourth drive sections may be configured to be driven with drive mechanisms other than the piezoelectric bodies. For example, magnetostrictive bodies deformed by a magnetic field of an electromagnet may be employed instead of the piezoelectric bodies.

While the example in which the first drive section 41 and the second drive section 42 obtained by division in the substantially central portion in the direction X and the third drive section 51 and the fourth drive section 52 obtained by division in the substantially central portion in the direction X have substantially the same length L3 in the direction X has been shown in the aforementioned first embodiment, the present invention is not restricted to this. According to the present invention, the first drive section, the second drive section, the third drive section, and the fourth drive section may have different lengths from each other or may not be provided by division in the substantially central portions in the direction X but may be provided by division in a deviated manner to one side in the direction X, so far as control of the inclination of the optical component in the biaxial direction is facilitated.

REFERENCE NUMERALS 1, 201, 301, 501: laser scanning portion (MEMS device)
10: light scanning portion (optical component)
16, 226: movable frame (movable portion)
21, 22, 321, 521, 522: drive portion
23, 223: fixing frame (fixing portion)
30, 330: drive unit
40, 340: first drive portion
41, 341: first drive section
41a: first drive electrode
42, 342: second drive section
42a: second drive electrode
44, 54: piezoelectric body
50: second drive portion
51: third drive section
51a: third drive electrode
52: fourth drive section
52a: fourth drive electrode
60: connecting portion (first connecting portion)
100: portable electronic device (electronic device having a projector function)
102: control portion
104: red laser diode (laser beam generation portion)
105: green laser diode (laser beam generation portion)
106: blue laser diode (laser beam generation portion)
107: acceleration sensor (vibration detecting portion)
270: spacer
381a, 382a: detection electrode
401: MEMS device
410: mirror portion (optical component)
A1: rotation axis line (first rotation axis line)
A2: rotation axis line (second rotation axis line)
R: center (symmetry center)

The invention claimed is:

1. A MEMS device comprising:
an optical component; and
only a pair of drive portions provided to hold the optical component therebetween including a first drive portion extending in a first direction a second drive portion extending in the first direction and a first connecting portion that connects the first drive portion to the second drive portion and is arranged along a second direction substantially orthogonal to the first direction, wherein
a drive element of the first drive portion consists of a first drive element which is a single-layered drive element and which drives only the first drive portion, and a drive section of the first drive portion consists of a rectangular first drive section, a rectangular second drive section arranged in series with the first drive section in the first direction, and an intermediate section formed between the first drive section and the second drive section,
a drive element of the second drive portion consists of a second drive element which is a single-layered drive element and which drives only the second drive portion, and a drive section of the second drive portion consists of a rectangular third drive section, a rectangular fourth drive section arranged in series with the third drive section in the first direction, and an intermediate section formed between the third drive section and the fourth drive section, and
the first, the second, the third, and the fourth drive sections of only the pair of drive portions are controlled for driving independently of each other to incline the optical component in a biaxial direction about a first rotation axis line and a second rotation axis line extending in the first direction and the second direction substantially orthogonal to each other in a same plane, respectively.

2. The MEMS device according to claim 1, wherein
the first drive section and the second drive section are controlled for driving substantially in a same manner and the third drive section and the fourth drive section are controlled for driving substantially in a same manner to incline the optical component about the first rotation axis line.

3. The MEMS device according to claim 1, wherein
the first drive section and the third drive section are controlled for driving substantially in a same manner and the second drive section and the fourth drive section are controlled for driving substantially in a same manner to incline the optical component about the second rotation axis line.

4. The MEMS device according to claim 1, wherein
the first drive section and the second drive section are controlled for driving substantially in a same manner and the third drive section and the fourth drive section are controlled for driving substantially in a same manner to incline the optical component about the first rotation axis line,
the first drive section and the third drive section are controlled for driving substantially in a same manner and the second drive section and the fourth drive section are controlled for driving substantially in a same manner to incline the optical component about the second rotation axis line, and
in the first drive section, the second drive section, the third drive section, and the fourth drive section, drive control about the first rotation axis line and drive control about the second rotation axis line are combined to incline the optical component in the biaxial direction about the first rotation axis line and the second rotation axis line.

5. The MEMS device according to claim 1, wherein
the first drive portion is divided into the first drive section and the second drive section in a vicinity of a central portion of the first drive portion in the first direction, and
the second drive portion is divided into the third drive section and the fourth drive section in a vicinity of a central portion of the second drive portion in the first direction.

6. The MEMS device according to claim 5, wherein
the first drive section and the second drive section of the first drive portion are formed to have a substantially same length in the first direction, and
the third drive section and the fourth drive section of the second drive portion are formed to have a substantially same length in the first direction.

7. The MEMS device according to claim 1, wherein
the first drive section and the second drive section of the first drive portion are formed in a state where the first drive section and the second drive section are separated from each other by a first distance in the first direction,
the third drive section and the fourth drive section of the second drive portion are formed in a state where the third drive section and the fourth drive section are separated from each other by a second distance in the first direction, and the first distance and the second distance are smaller than a width of the first drive portion in the second direction and a width of the second drive portion in the second direction, respectively.

8. The MEMS device according to claim 1, wherein a pair of the first drive portions and a pair of the second drive portions are provided to hold the optical component therebetween, and the pair of first drive portions and the pair of the second drive portions are formed to be substantially point-symmetric to each other, using a substantially central portion of the optical component as a symmetry center.

9. The MEMS device according to claim 8, wherein the pair of first drive portions substantially point-symmetric to each other are controlled for driving in a different manner, and the pair of second drive portions substantially point-symmetric to each other are controlled for driving in a different manner.

10. The MEMS device according to claim 1, further comprising:

a plurality of drive units that include a first drive unit including the first drive portion, the second drive portion, and the first connecting portion, and a second drive unit arranged adjacent to the first drive unit along the second direction, including a third drive portion extending in the first direction, a fourth drive portion extending in the first direction, and a second connecting portion that is arranged along the second direction and connects the third portion to the fourth drive portion; and a third connecting portion that connects the first drive unit to be the second drive unit, wherein a drive section of the third drive portion consists of a rectangular fifth drive section, a rectangular sixth drive section arranged in series with the fifth drive section in the first direction, and an intermediate section formed between the fifth drive section and the sixth drive section, a drive section of the fourth device portion consists of a rectangular seventh drive section, a rectangular eighth drive section arranged in series with the seventh drive section in the first direction, and an intermediate section formed between the seventh drive section and the eighth drive section, and the plurality of drive units, in which the fourth drive section of the first drive unit and the fifth drive section of the second drive unit are connected by the third connection portion, are formed to meander.

11. The MEMS device according to claim 1, wherein the first drive section, the second drive section, the third drive section, and the fourth drive section are driven by deformation of a piezoelectric body resulting from voltage application to the piezoelectric body and have a first drive electrode, a second drive electrode, a third drive electrode, and a fourth drive electrode, respectively, and the first drive section, the second drive section, the third drive section, and the fourth drive section are controlled for driving independently of each other by application of voltages different from each other to the first drive electrode, the second drive electrode, the third drive electrode, and the fourth drive electrode.

12. The MEMS device according to claim 11, further comprising:

a plurality of drive units that include the first drive portion, the second drive portion and the first connecting portion, a movable portion where the optical component is arranged, connected to a first end of the drive units; and a fixing portion fixing a second end of the drive units, wherein the drive units further include a detection electrode capable of detecting driving of the drive units based on deformation of the piezoelectric body, and the detection electrode is provided in the drive unit located at the second end of the plurality of drive units fixed to the fixing portion.

13. The MEMS device according to claim 1, further comprising:

a plurality of drive units that includes the first drive portion, the second drive portion and the first connecting portion, a movable portion where the optical component is arranged, connected to a first end of the plurality of drive units;

a fixing portion fixing a second end of the plurality of drive units; and a spacer that provides the optical component in a stacked arrangement in the movable portion in a state where the optical component and the plurality of drive units are separated from each other in a third direction substantially orthogonal to the first direction and the second direction.

14. The MEMS device according to claim 1, wherein the optical component is resonantly driven, and the first drive portion and the second drive portion perform non-resonant drive.

15. The MEMS device according to claim 1, comprising:

a plurality of drive units that include the first drive portion, the second drive portion and the first connection portion; and a movable portion where the optical component is arranged, connected to a first end of the drive units, wherein the first end of the drive units is connected to a corner of the movable portion.

16. An electronic device having a projector function, comprising:

a laser beam generation portion emitting a laser beam;

a control portion analyzing an input picture and recognizing pixel information; and a laser scanning portion including a MEMS device scanning the laser beam, wherein the MEMS device includes:

an optical component; and only a pair of drive portions provided to hold the optical component therebetween including a first drive portion extending in a first direction a second drive portion extending in the first direction and a first connecting portion that connects the first drive portion to the second drive portion and is arranged along a second direction substantially orthogonal to the first direction, wherein a drive element of the first drive portion consists of a first drive element which is a single-layered drive element and which drives only the first drive portion, and a drive section of the first drive portion consists of a rectangular first drive section, a rectangular second drive section arranged in series with the first drive section in the first direction, and an intermediate section formed between the first drive section and the second drive section,
a drive element of the second drive portion consists of a second drive element which is a single-layered drive element and which drives only the second drive portion, and a drive section of the second drive portion consists of a rectangular third drive section, a rectangular fourth drive section arranged in series with the third drive section in the first direction, and an intermediate section formed between the third drive section and the fourth drive section, and
the first, the second, the third, and the fourth drive sections of only the pair of drive portions are controlled for driving independently of each other to incline the optical component in a biaxial direction about a first rotation axis line and a second rotation axis line extending in the first direction and the second direction substantially orthogonal to each other in a same plane, respectively.

17. The electronic device having a projector function according to claim 16, further comprising a vibration detecting portion capable of detecting vibration of the electronic device, wherein the control portion corrects a shake by performing control of inclining the optical component of the MEMS device on the basis of the vibration of the electronic device resulting from the shake detected by the vibration detecting portion.

18. The electronic device having a projector function according to claim 16, wherein
the first drive section and the second drive section are controlled for driving substantially in a same manner and the third drive section and the fourth drive section are controlled for driving substantially in a same manner to incline the optical component about the first rotation axis line.

19. The electronic device having a projector function according to claim 16, wherein
the first drive section and the third drive section are controlled for driving substantially in a same manner and the second drive section and the fourth drive section are controlled for driving substantially in a same manner to incline the optical component about the second rotation axis line.

* * * * *